United States Patent
Kashima et al.

(10) Patent No.: US 9,929,311 B2
(45) Date of Patent: Mar. 27, 2018

(54) SEMICONDUCTOR LIGHT EMITTING ELEMENT AND METHOD FOR PRODUCING THE SAME

(71) Applicants: MARUBUN CORPORATION, Tokyo (JP); TOSHIBA KIKAI KABUSHIKI KAISHA, Tokyo (JP); RIKEN, Saitama (JP); NATIONAL INSTITUTE OF ADVANCED INDUSTRIAL SCIENCE AND TECHNOLOGY, Tokyo (JP); ULVAC, INC., Kanagawa (JP); TOKYO OHKA KOGYO CO., LTD., Kanagawa (JP)

(72) Inventors: Yukio Kashima, Tokyo (JP); Eriko Matsuura, Tokyo (JP); Mitsunori Kokubo, Shizuoka (JP); Takaharu Tashiro, Shizuoka (JP); Takafumi Ookawa, Shizuoka (JP); Hideki Hirayama, Saitama (JP); Sung Won Youn, Ibaraki (JP); Hideki Takagi, Ibaraki (JP); Ryuichiro Kamimura, Shizuoka (JP); Yamato Osada, Shizuoka (JP); Satoshi Shimatani, Kanagawa (JP)

(73) Assignees: MARUBUN CORPORATION, Tokyo (JP); TOSHIBA KIKAI KABUSHIKI KAISHA, Tokyo (JP); RIKEN, Saitama (JP); NATIONAL INSTITUTE OF ADVANCED INDUSTRIAL SCIENCE & TECHNOLOGY, Tokyo (JP); ULVAC, INC., Kanagawa (JP); TOKYO OHKA KOGYO CO., LTD., Kanagawa (JP)

( * ) Notice: Subject to any disclaimer, the term of this patent is extended or adjusted under 35 U.S.C. 154(b) by 0 days.

(21) Appl. No.: 14/777,176

(22) PCT Filed: Jul. 16, 2014

(86) PCT No.: PCT/JP2014/068864
§ 371 (c)(1),
(2) Date: Sep. 15, 2015

(87) PCT Pub. No.: WO2015/008776
PCT Pub. Date: Jan. 22, 2015

(65) Prior Publication Data
US 2016/0042102 A1    Feb. 11, 2016

(30) Foreign Application Priority Data

Jul. 17, 2013    (JP) .................................. 2013-148234

(51) Int. Cl.
*H01L 33/22* (2010.01)
*G06F 17/50* (2006.01)
(Continued)

(52) U.S. Cl.
CPC ............. *H01L 33/22* (2013.01); *G06F 17/10* (2013.01); *G06F 17/5009* (2013.01);
(Continued)

(58) Field of Classification Search
CPC ....... H01L 33/22; H01L 33/44; H01L 33/502; G06F 17/5009
See application file for complete search history.

(56) References Cited

U.S. PATENT DOCUMENTS

| 5,337,328 A | 8/1994 | Lang et al. |
| 5,955,749 A | 9/1999 | Joannopoulos et al. |

(Continued)

FOREIGN PATENT DOCUMENTS

| CN | 103354956 | 10/2013 |
| DE | 102009057780 | 6/2001 |

(Continued)

OTHER PUBLICATIONS

International search report for International application No. PCT/JP2015/071453, dated Sep. 29, 2015 (8 pages).

(Continued)

*Primary Examiner* — Jose R Diaz
(74) *Attorney, Agent, or Firm* — Hamre, Schumann, Mueller & Larson, P.C.

(57) ABSTRACT

A semiconductor light emitting element with a design wavelength of λ, comprising a photonic crystal periodic structure having two structures with different refractive indices at each of one or more interfaces between layers that form the light emitting element. The period a and the radius R that are parameters of each of the one or more periodic structures and the design wavelength λ satisfy Bragg conditions. The ratio (R/a) between the period a and the radius R is a value determined so that a predetermined photonic band gap (PBG) for TE light becomes maximum for each periodic structure. The parameters of each periodic structure are
(Continued)

determined so that light extraction efficiency of the entire semiconductor light emitting element with respect to light with the wavelength λ becomes maximum as a result of conducting a simulation analysis with a FDTD method using as variables the depth h of the periodic structure that is of greater than or equal to 0.5a and the period a and the radius R that are determined for each order m of the Bragg conditions.

1 Claim, 15 Drawing Sheets

(51) Int. Cl.
 *G06F 17/10* (2006.01)
 *H01L 33/44* (2010.01)
 *H01L 33/50* (2010.01)
 *H01L 33/24* (2010.01)

(52) U.S. Cl.
 CPC ............ *H01L 33/44* (2013.01); *H01L 33/502* (2013.01); *H01L 33/24* (2013.01); *H01L 2933/0083* (2013.01)

(56) References Cited

U.S. PATENT DOCUMENTS

| | | | |
|---|---|---|---|
| 7,520,742 B2 | 4/2009 | Motowaki et al. | |
| 7,687,811 B2* | 3/2010 | Jang | H01L 33/20 257/84 |
| 8,405,103 B2* | 3/2013 | Lee | H01L 33/42 257/13 |
| 8,419,995 B2 | 4/2013 | Yoneda et al. | |
| 8,703,837 B2 | 4/2014 | Kawaguchi | |
| 9,005,502 B2 | 4/2015 | Chiba et al. | |
| 9,073,102 B2 | 7/2015 | Yoshida | |
| 9,263,549 B2 | 2/2016 | Rodder et al. | |
| 9,349,918 B2* | 5/2016 | Kashima | H01L 33/20 |
| 2002/0167013 A1 | 11/2002 | Iwasaki | |
| 2004/0016936 A1 | 1/2004 | Tanaka et al. | |
| 2004/0113166 A1 | 6/2004 | Tadatomo et al. | |
| 2004/0114652 A1 | 6/2004 | Yoshikawa | |
| 2004/0206962 A1 | 10/2004 | Erchak et al. | |
| 2004/0252509 A1 | 12/2004 | Lin | |
| 2004/0264903 A1 | 12/2004 | Dridi et al. | |
| 2006/0043400 A1 | 3/2006 | Erchack et al. | |
| 2006/0255341 A1 | 11/2006 | Pinnington et al. | |
| 2006/0284187 A1 | 12/2006 | Wierer et al. | |
| 2007/0081253 A1 | 4/2007 | Yamauchi | |
| 2007/0177644 A1 | 8/2007 | Corzine | |
| 2007/0257269 A1 | 11/2007 | Cho et al. | |
| 2008/0024053 A1 | 1/2008 | Fujimoto et al. | |
| 2008/0061304 A1 | 3/2008 | Huang et al. | |
| 2008/0258160 A1 | 10/2008 | Do | |
| 2009/0134425 A1 | 5/2009 | Nagai | |
| 2009/0184334 A1 | 7/2009 | Lee et al. | |
| 2010/0072501 A1 | 3/2010 | Wakai et al. | |
| 2010/0140643 A1 | 6/2010 | Cho et al. | |
| 2010/0237372 A1 | 9/2010 | Kim et al. | |
| 2011/0068676 A1 | 3/2011 | Jeon et al. | |
| 2011/0309326 A1 | 12/2011 | Gaska et al. | |
| 2012/0027038 A1 | 2/2012 | Noda et al. | |
| 2012/0112165 A1 | 5/2012 | Charlton et al. | |
| 2012/0224147 A1 | 9/2012 | Tomiyama et al. | |
| 2012/0228653 A1 | 9/2012 | Ishida et al. | |
| 2012/0247950 A1 | 10/2012 | Kaida et al. | |
| 2012/0261642 A1 | 10/2012 | Bergenek et al. | |
| 2013/0009167 A1* | 1/2013 | Tan | H01L 33/44 257/77 |
| 2013/0026531 A1 | 1/2013 | Seo et al. | |
| 2013/0037820 A1 | 2/2013 | Tsukihara et al. | |
| 2013/0043500 A1 | 2/2013 | Orita | |
| 2013/0069034 A1 | 3/2013 | Hirayama | |
| 2013/0146916 A1 | 6/2013 | Yamamoto et al. | |
| 2013/0222770 A1 | 8/2013 | Tomiyama | |
| 2013/0320301 A1 | 12/2013 | Seo et al. | |
| 2013/0328013 A1 | 12/2013 | Inazu et al. | |
| 2014/0057377 A1 | 2/2014 | Kamimura et al. | |
| 2014/0084317 A1 | 3/2014 | Lee et al. | |
| 2014/0151733 A1 | 6/2014 | Koike et al. | |
| 2014/0167066 A1 | 6/2014 | Kashima et al. | |
| 2015/0044417 A1 | 2/2015 | Koike | |
| 2015/0214448 A1 | 7/2015 | Lee et al. | |
| 2016/0042102 A1 | 2/2016 | Kashima et al. | |
| 2016/0133785 A1 | 5/2016 | Kashima et al. | |

FOREIGN PATENT DOCUMENTS

| | | |
|---|---|---|
| EP | 1526583 | 4/2005 |
| EP | 2690650 | 1/2014 |
| EP | 2827361 | 1/2015 |
| EP | 2942818 | 11/2015 |
| JP | 2002305328 | 10/2002 |
| JP | 2007109689 | 4/2004 |
| JP | 2004200209 | 7/2004 |
| JP | 2005012160 | 1/2005 |
| JP | 2006196658 | 7/2006 |
| JP | 2006276388 | 10/2006 |
| JP | 2006523953 | 10/2006 |
| JP | 2007036186 | 2/2007 |
| JP | 2007294789 | 11/2007 |
| JP | 2007305998 | 11/2007 |
| JP | 2008030235 | 2/2008 |
| JP | 2008053425 | 3/2008 |
| JP | 2008098526 | 4/2008 |
| JP | 2008117922 | 5/2008 |
| JP | 2008538658 | 10/2008 |
| JP | 2008311317 | 12/2008 |
| JP | 2009033180 | 2/2009 |
| JP | 4329374 | 9/2009 |
| JP | 2009267263 | 11/2009 |
| JP | 2010074008 | 4/2010 |
| JP | 2010074090 | 4/2010 |
| JP | 2010135798 | 6/2010 |
| JP | 200981469 | 10/2010 |
| JP | 4610863 | 1/2011 |
| JP | 2011086853 | 4/2011 |
| JP | 2011228513 | 11/2011 |
| JP | 2012186414 | 9/2012 |
| JP | 2013009002 | 1/2013 |
| JP | 2013120829 | 6/2013 |
| JP | 2013530537 | 7/2013 |
| JP | 5315513 | 10/2013 |
| JP | 2014068010 | 4/2014 |
| JP | 2015041763 | 3/2015 |
| JP | 5757512 | 7/2015 |
| JP | 2015195388 | 11/2015 |
| KR | 20090001903 | 1/2009 |
| KR | 20110131212 | 12/2011 |
| KR | 20120117892 | 10/2012 |
| KR | 20130055015 | 5/2013 |
| KR | 20140133607 | 11/2014 |
| TW | 201535782 | 9/2015 |
| WO | 2008041161 | 4/2008 |
| WO | 2009148138 | 12/2009 |
| WO | 2011049018 | 4/2011 |
| WO | 2011104969 | 9/2011 |
| WO | 2012067080 | 5/2012 |
| WO | 2012127660 | 9/2012 |
| WO | 2013008556 | 1/2013 |
| WO | 2013530537 | 7/2013 |
| WO | 2013132993 | 9/2013 |
| WO | 2015008776 | 1/2015 |
| WO | 2013137176 | 8/2015 |
| WO | 2015133000 | 9/2015 |
| WO | 2016113935 | 7/2016 |

OTHER PUBLICATIONS

Hirayama et al: "Recent progress and future prospects of ALgaN-based high-efficiency deep-ultraviolet light-emitting diodes"; Japanese Journal of Applied Physics, vol. 53, 2014, pp. 1-10.

(56) References Cited

OTHER PUBLICATIONS

Shinji Matsui: "Current Nano-imprint processing technologies"; Monthly Display, 2005, vol. 11, No. 5, pp. 82-89.
Nakamatsu et al.: "Bilayer Resist Method for Room-Temperature Nanoimprint Lithography"; Japanese Journal of Applied Physics, 2004, vol. 43, No. 6B, pp. 4050-4053.
Korean Office Action for Korean application No. 2015-7005308, dated Oct. 21, 2015 (6 pages).
Extended European Search Report issued in the corresponding European Patent Application No. 14841324.8 dated Oct. 23, 2015 (6 pages).
International search report for International application No. PCT/JP2014/068864 dated Sep. 9, 2014 (4 pages).
Office Action dated Jun. 1, 2015 in corresponding Korean Application (6 pages).
T. Nakashima et al.: "Improvment of the light extraction efficiency in 350-nm-emission UV-LED," Proceedings of the [[6]]60th Lecture Presentation in Spring of the Japan Society of Applied Physics, 2013, 29p-G21-10, 2 pages total (English translation provided).
CREST Research Area of the Strategic Basic Research Programs: "Light/Photon Science and Technology toward Creation of New Function," Report of Termination of Research for Research Subject: "Research of 230-350mm Band in AlGaN-based Deep Ultraviolet High-Efficiency Light Emitting Device," Research period: Oct. 2007 to Mar. 2013, 53 pages total (Partial English Translation provided).
Delbeke et al.: "Rigorous electromagnetic analysis of dipole in periodically corrugated layers: the grating-assisted resonant-cavity light-emitting diode." J. Opt. Soc. AM. A, 2002, vol. 64, No. 19, No. 5, pp. 871-880.
Gourley et al.: "Optical properties of two-dimensional photonic lattices fabricated as honeycomb nanostructures in compound semiconductors," Applied Physics Letters, 1994, vol. 64, No. 6, pp. 687-689.
Xie et al.: "Optimization design and fabrication of photonic crystal waveguides based on SOI using 248nm deep UV lithography," Proceedings of SPIE, 2004, vol. 5280, pp. 798-804.
Japan Society for the Promotion of Science: "Wide-gap semiconductor/electronic device, No. 162 committee"; The 74th Workshop Document: Development of DUVLED by UV Craftory, Co., Ltd., dated Apr. 22, 2011.
International Search Report issued in corresponding Japanese Application No. PCT/JP2015/084461 dated Jan. 12 2016 (10 pages).
Choi et al: "Design of an LED Chip Structure with an Integrated Two-dimensional Photonic Crystal to Enhance the light-extraction Efficiency"; Journal of Korean Physical Society, 2014, vol. 94, No. 10, pp. 1425-1429.
Lai et al.: "Directional light extraction enhancement from GaN-based film-transferred photonic crystal light-emitting lodes"; Applied Physics Letters, 2009, vol. 64, pp. 123106-1 to 123106-3 (4 pages).
Orita et al.: "High-Extraction-Efficiency blue Light-Emitting Diode using Extended-Pitch Photonic Crystal"; 2004, vol. 43, No. 8B, pp. 5809-5813.
Ding et al: "Improving the Vertical light-Extraction Efficiency of GaN-Based Thin-Film Flip-Chip LED's With p-slide Deep-Hole Photonic Crystals"; Journal of Display Technology, 2014, vol. 10, No. 11, pp. 909-916.
Kashima et al.: "The micro machining process technology of nano imprint and dry etcing to improve the efficiency of notride LED"; IEICE Technical Report, 2014, vol. 114, No. 336, pp. 27-32.
Chinese Office Action dated Dec. 19, 2016 for Chinese Patent Application Serial No. 201480002228.2, 3 pages.
International Search Report issued in International Application No. PCT/JP2016/075756 dated Nov. 8, 2016 (3 pages).
International Search Report issued in International Application No. PCT/JP2016/082397 dated Dec. 6, 2016 (3 pages).
Supplementary European Search Report issued in European Application No. 16861100.2 dated Jul. 17, 2017 (12 pages).

* cited by examiner

Fig. 4A
(a)
Top Surfaces of Photonic Crystals (Triangular Lattice)
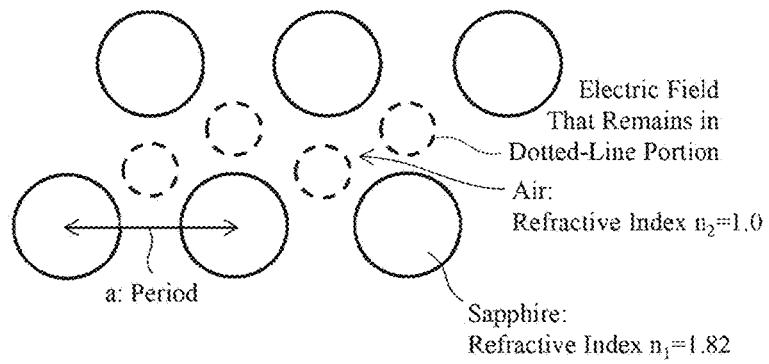
(b)
Side Surfaces of Photonic Crystals
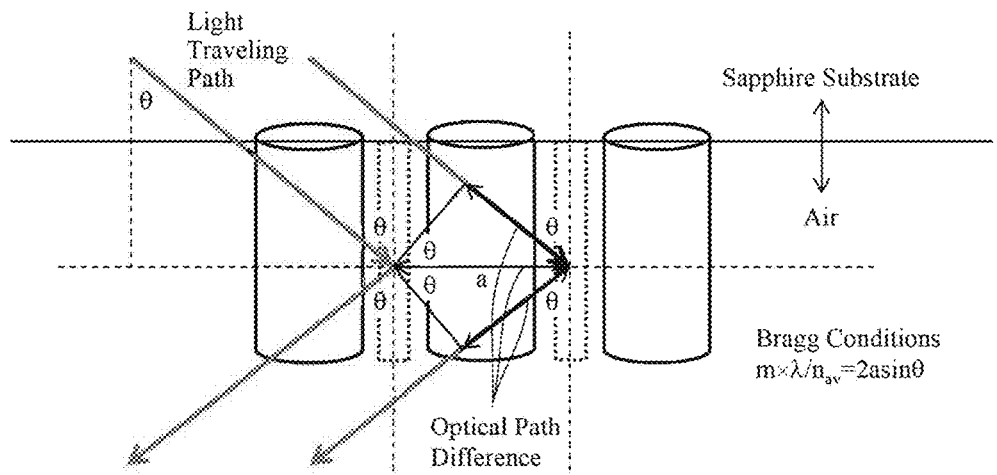

Fig. 4B
(a)
Top Surfaces of Photonic Crystals (Triangular Lattice)
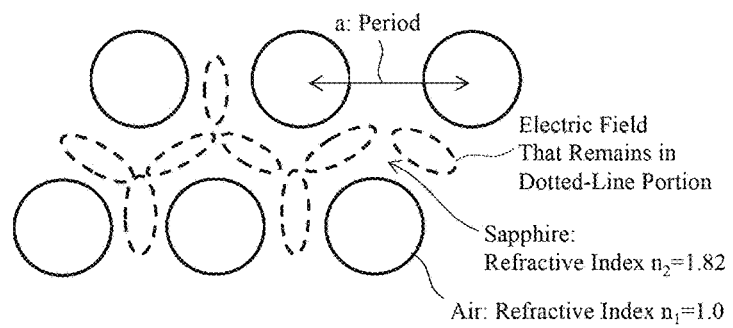
(b)
Side Surfaces of Photonic Crystals
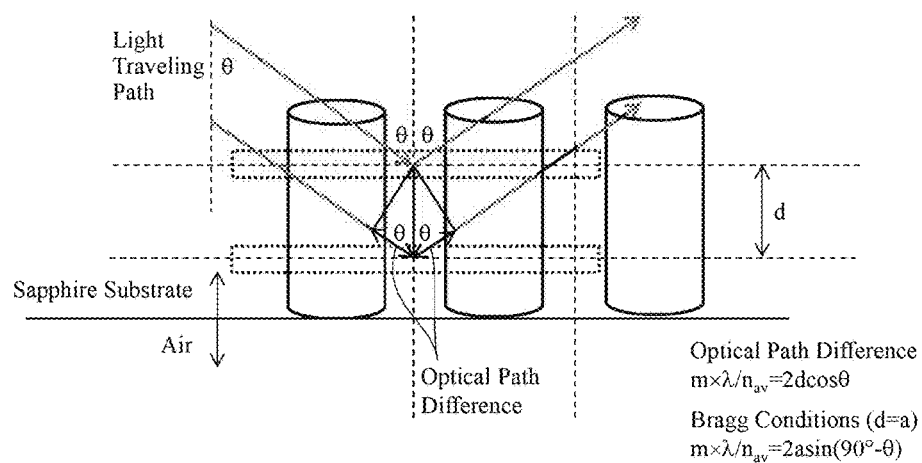
Optical Path Difference
$m \times \lambda / n_{av} = 2d\cos\theta$
Bragg Conditions (d=a)
$m \times \lambda / n_{av} = 2a\sin(90° - \theta)$ Computation Model
(x,y,z)=(14.54μm,14.54μm,14.915μm)

(1) Phc Pillars @ Sapphire Substrate
(2) Sapphire Substrate (9μm)
(3) AlN Buffer Layer (4μm)
(4) n-AlGaN Buffer Layer (1.4μm)
(5) Barrier Layer (10nm)
(6) Well Layer (5nm)
(7) Barrier Layer (10nm)
(8) Electron Blocking Layer (20nm)
(9) p-AlGaN Layer (20nm)
(10) p-AlGaN Contact Layer (300nm)
(11) Al Reflecting Electrode (150nm)

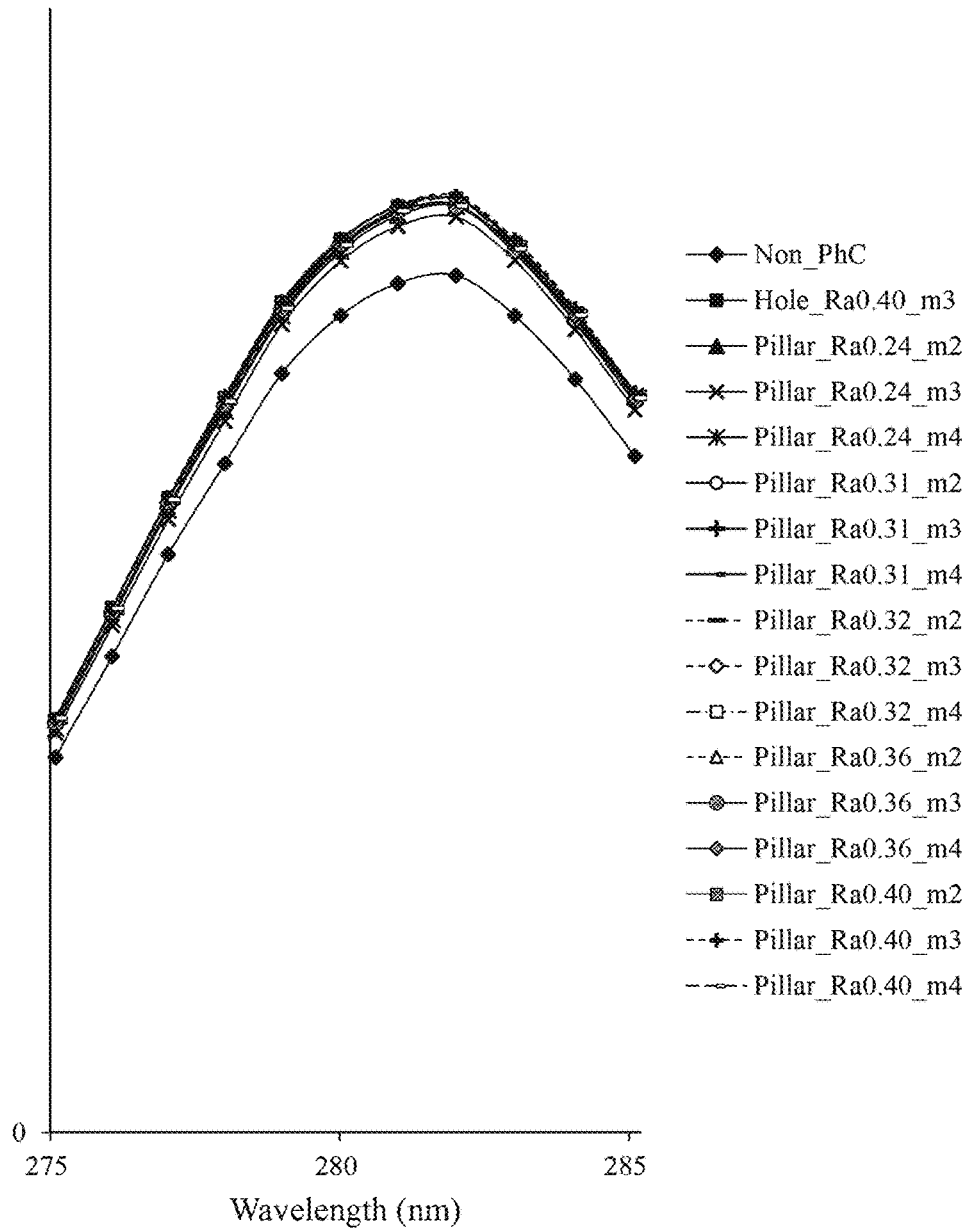

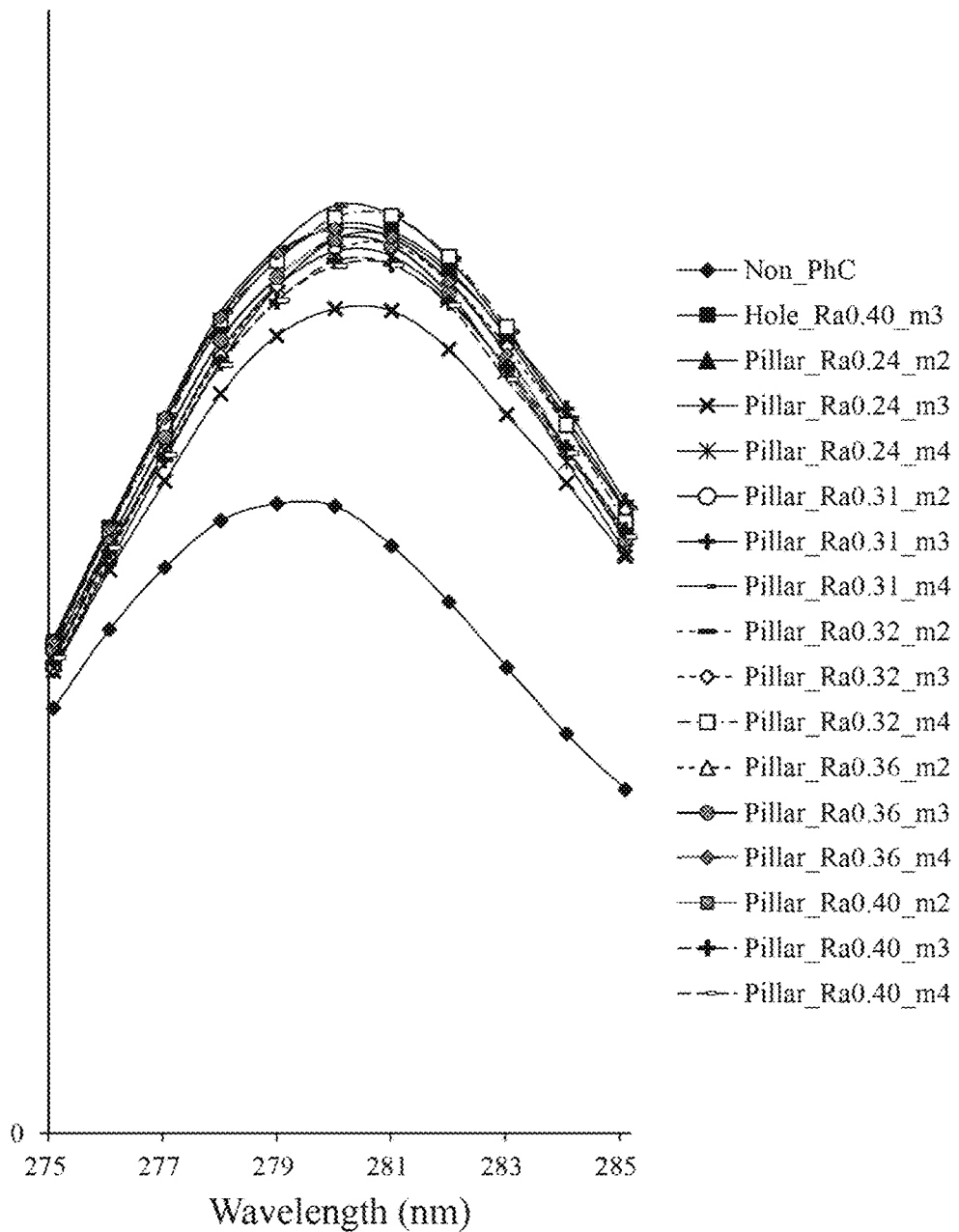

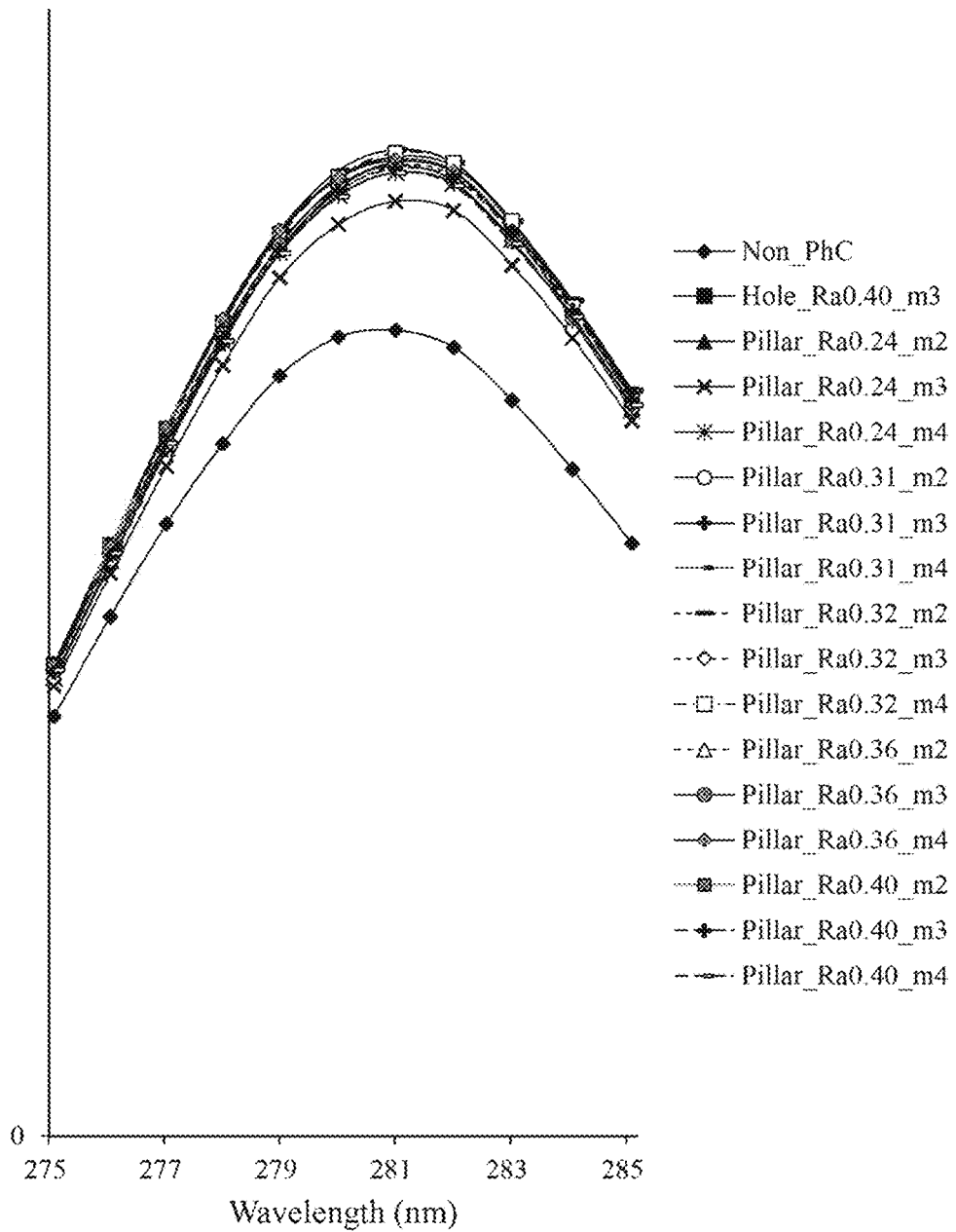

SEMICONDUCTOR LIGHT EMITTING ELEMENT AND METHOD FOR PRODUCING THE SAME

This application is a 371 of PCT/JP2014/068864 filed on Jul. 16, 2014.

TECHNICAL FIELD

The present invention relates to a semiconductor light emitting element and a method for producing the same.

BACKGROUND ART

Semiconductor light emitting elements typified by light emitting diodes (LED) and organic EL (OLED) have been required to have high luminance as a light source to be used for illumination. A method for improving the light extraction efficiency by using a sapphire substrate that has micron-size projections/recesses formed on its surface (PSS: Patterned Sapphire Substrate) is common. Further, as a new method for improving the light extraction efficiency, a technique of forming a photonic crystal periodic structure with a period that is about equal to the wavelength of light on a light extraction layer has been introduced. Typically, a photonic crystal periodic structure is formed at the interface between two structures with different refractive indices, and has projections/recesses that are mainly formed of pillar structures or hole structures. It is known that in a region in which such a periodic structure is formed, the presence of light is prohibited and total reflection is thus suppressed; thus, using this can contribute to improving the light extraction efficiency.

However, although light emitted from a light emitting layer of a semiconductor light emitting element includes both transversal magnetic light (TM light) and transversal electric light (TE light), optimization of the behavior of each light in the periodic structure, that is, optimization of the periodic structure depending on whether the periodic structure reflects or transmits each light has not been clarified.

It is known that light emitted from an InGaN-based LED is mainly TE light, while light emitted from an $Al_xGa_{1-x}N$-based LED, which is obtained by forming a single well layer on the c-plane of a sapphire substrate, is mainly TM light if the content of Al is in the range of up to x=0.25, and the proportion of TM light will increase with an increase in x (it should be noted that the properties of TE/TM polarized light in the quantum well were evaluated by measuring the intensity of photoluminescence at a temperature of 8.5 K "Applied Physics Letters," No. 25, Jun. 21, 2004, Vol. 84).

Further, it has been reported that when an AlN buffer layer and a multi-quantum well of $Al_xGa_{1-x}N$/AlN are grown on the c-plane of a sapphire substrate, TM light becomes dominant if the content of Al is in the range of up to x=0.82, and the proportion TM light will increase if the thickness of the well layer is set to less than or equal to 3 nm with the content of Al unchanged ("Physical Review," B 79, 121308 (2009)").

The relationship between TE light and TM light in the present invention is defined as follows. In the present invention, TE light refers to light whose electric field components oscillate in the transverse direction with respect to the plane of a photonic crystal periodic structure, that is, a plane along a direction in which the periodic structure changes periodically, while TM light refers to light whose magnetic field components oscillate in the transverse direction with respect to the plane of a periodic structure. That is, TM light is light whose electric field components oscillate in the direction perpendicular to the plane of the periodic structure.

In Patent Literature 1, when the parameters of a photonic crystal periodic structure in a light extraction layer are designed, a photonic band structure for each of TE light and TM light is computed, and consequently, TE light for which a wider PBG exists is selected to optimize the design of the parameters of the periodic structure.

In Patent Literature 2, a waveguide is designed in a photonic crystal slab with a PBG for each of a TM-like mode and a TE-like mode, whereby leakage of light into the crystal plane is prevented, and a high Q value is thus exhibited.

In Patent Literature 3, a first conductive type semiconductor layer has formed thereon a photonic crystal periodic crystal structure that contains $SiO_2$ and air gaps and has a smaller refractive index than the first conductive type semiconductor layer, whereby light is allowed to become incident on a non-conductive semiconductor layer thereon.

In Patent Literature 4, photonic crystals are formed between a first phosphor layer and a second phosphor layer so as to transmit second converted light and reflect first converted light.

Patent Literature 5 discloses a structure in which a fluorescent material layer that has a two-dimensional periodic structure and has a photonic band gap for TE polarized light is provided on an outer portion of an optical waveguide, thus providing the effect of efficiently confining TE polarized light in the optical waveguide.

CITATION LIST

Patent Literature

Patent Literature 1: WO 2013008556 A
Patent Literature 2: JP 2006-276388A
Patent Literature 3: JP 2010-135798 A
Patent Literature 4: JP 2012-186414 A
Patent Literature 5: JP 2011-228513 A

SUMMARY OF INVENTION

Technical Problem

Patent Literature 1 does not specifically disclose the validity of selection of light or a method for maximizing the light extraction efficiency for when similar selection of light is combined for a plurality of periodic structures in the semiconductor light emitting element.

In Patent Literature 2, the waveguide element and the semiconductor light emitting element have a decisive difference in the propagation direction of light for the photonic crystal periodic structure. Thus, a method for designing the waveguide element cannot be applied to the semiconductor light emitting element.

In Patent Literature 3, light that becomes incident on the first conductive type semiconductor layer from an active layer is transmitted more than it is reflected depending on the parameters of the periodic structure. Thus, Patent Literature 3 cannot be said to disclose an optimization method for maximizing the light extraction efficiency.

Patent Literature 4 does not disclose which of TM light or TE light should be optimized. Thus, Patent Literature 4 cannot be said to disclose a method for optimizing a periodic structure for maximizing the light extraction efficiency.

Patent Literature 5 does not disclose optimization of the parameters of the periodic structure or optimization of the parameters of the periodic structure depending on whether TE polarized light or TM polarized light is used.

For each of the aforementioned periodic structures, a transfer technology that is based on a nanoimprinting lithography method is known as a method for transferring the periodic structure to a large area of a target to be processed at once. However, organic resist that is usually used for such a transfer technology should have high fluidity as the transfer method entails supplying the resist to fill a pattern of a mold while applying pressure to the mold and the substrate. However, if the fluidity of the resist is prioritized, it is concerned that etching selectivity for a target on which a periodic structure is to be formed may become insufficient. Further, the size of the periodic structure of the mold is not the same as the size of the periodic structure that is formed after the etching.

It is an object of the present invention to increase the light extraction efficiency of a semiconductor light emitting element.

Solution to Problem

The present invention relates to design of the parameters of a photonic crystal periodic structure that is formed at each of one or more interfaces of interest in a semiconductor light emitting element so as to maximize the light extraction efficiency of the element. It is an object of the present invention to provide a guidance about, in accordance with which of reflection or transmission of light is intended by the formation of each periodic structure, for which of TE light or TM light the parameters of the periodic structure should be optimized, and a specific optimization method therefor. In addition, the present invention also provides a semiconductor light emitting element that has a periodic structure, which has been optimized in accordance with the position at which the periodic structure is formed as well as the function thereof, formed at each of one or more interfaces. Further, the present invention also provides a transfer technology for accurately reproducing the periodic structure as designed on a large area of a target member on which the periodic structure is to be formed.

According to one aspect of the present invention, there is provided a semiconductor light emitting element with a design wavelength of λ, including a photonic crystal periodic structure having two structures with different refractive indices, the photonic crystal periodic structure being formed at each of one or more interfaces between layers that form the light emitting element. The period a and the radius R that are parameters of each of the one or more periodic structures and the design wavelength λ satisfy Bragg conditions. The ratio (R/a) between the period a and the radius R is a value that is determined so that a photonic band gap (PBG) for TE light becomes maximum for each periodic structure. The parameters of each periodic structure are determined so that the light extraction efficiency of the entire semiconductor light emitting element with respect to light with the wavelength λ becomes maximum as a result of conducting a simulation analysis with a FDTD method using as variables the depth h of the periodic structure that is greater than or equal to 0.5a and the period a and the radius R that are determined for each order m of the Bragg conditions.

According to another aspect of the present invention, there is provided a semiconductor light emitting element with a design wavelength of λ, including a photonic crystal periodic structure having two structures with different refractive indices, the photonic crystal periodic structure being formed at each of one or more interfaces between layers that form the light emitting element. The period a and the radius R that are parameters of each of the one or more periodic structures and the design wavelength λ satisfy Bragg conditions. The ratio (R/a) between the period a and the radius R is a value that is determined so that a predetermined photonic band gap (PBG) for TM light becomes maximum for each periodic structure. The parameters of each periodic structure are determined so that the light extraction efficiency of the entire semiconductor light emitting element with respect to light with the wavelength λ becomes maximum as a result of conducting a simulation analysis with a FDTD method using as variables the depth h of the periodic structure that is greater than or equal to 0.5a and the period a and the radius R that are determined for each order m of the Bragg conditions.

This specification contains the descriptions of the specification and/or drawings of the Japanese patent application JP 2013-148234 that serves as a basis for priority claim of the present application.

Advantageous Effects of Invention

According to the present invention, the light extraction efficiency of a semiconductor light emitting element can be increased.

BRIEF DESCRIPTION OF DRAWINGS

FIG. 4A shows the behavior of TM light that satisfies the Bragg conditions (Bragg diffraction) in a photonic crystal periodic structure.

FIG. 4B shows the behavior of TE light that satisfies the Bragg conditions (Bragg diffraction) in a photonic crystal periodic structure.

FIG. 6 shows the relationship between a PBG for TM light and R/a.

FIG. 8A shows comparison of the output characteristics on the sidewalls as the analysis results of FDTD.

FIG. 8B shows comparison of the output characteristics on the top portion as the analysis results of FDTD.

FIG. 8C shows comparison of the total output characteristics on the sidewalls and the top portion as the analysis results of FDTD.

DESCRIPTION OF EMBODIMENTS

Figure 1A:
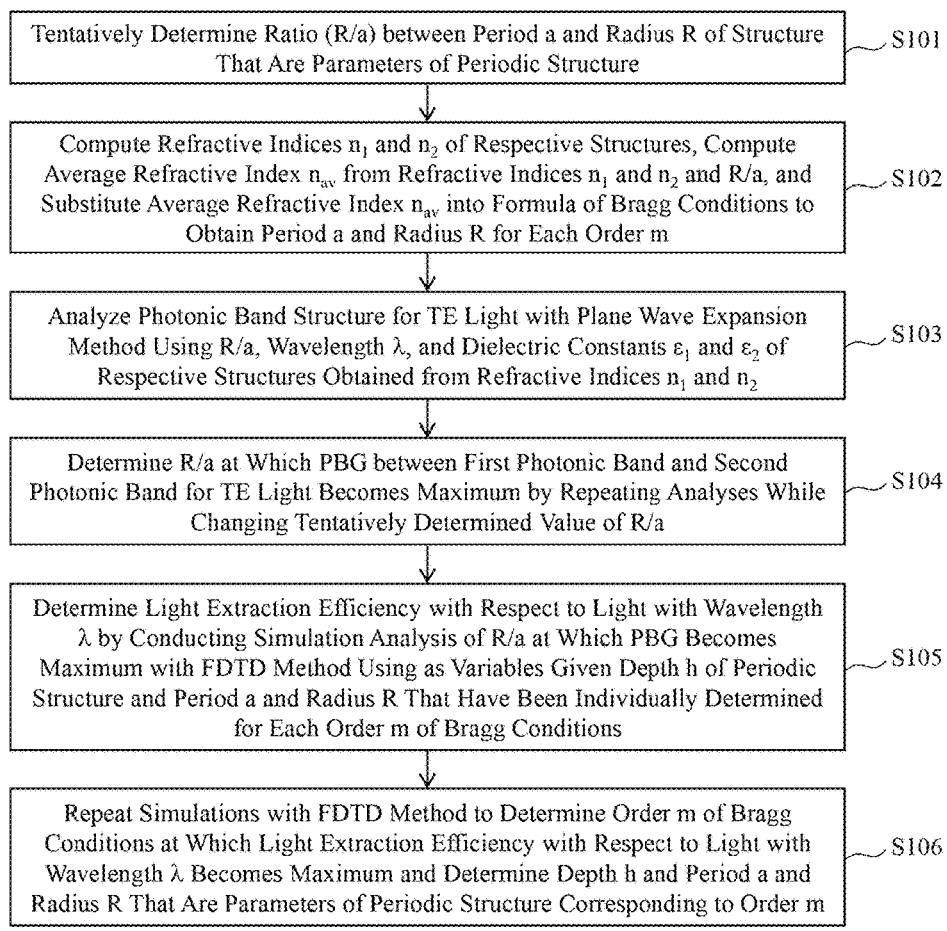
FIG. 1A is a flowchart showing a flow of a first optimization process for the parameters of a photonic crystal periodic structure in accordance with a second embodiment of the present invention, which schematically shows a flow for maximizing a PBG for TE light.

Embodiments for implementing the present invention will be described with reference to the drawings. It should be noted that the structure and the composition materials of a LED element, as well as the shape of a periodic structure (e.g., pillar structure or hole structure) and the like in the following embodiments are not limited thereto, and can be changed as appropriate within the range that the advantageous effects of the present invention can be exerted. Further, the embodiments can also be implemented by being changed as appropriate within the scope of the object of the present invention. For example, the present invention includes a program for designing a periodic structure, a die processed on the basis of the present invention, and the like.

First Embodiment

A semiconductor light emitting element in accordance with this embodiment is a semiconductor light emitting element with a design wavelength of $\lambda$ that has, at each of one or more interfaces between layers that form the semiconductor light emitting element, a photonic crystal periodic structure that is individually controlled to transmit or reflect light with a wavelength of $\lambda$ at each interface.

Herein, the photonic crystal periodic structure at the interface has two structures with different refractive indices, and the period a and the radius R, which are the parameters of the periodic structure, are designed to satisfy the Bragg conditions in relation to the wavelength of $\lambda$. If photonic crystal periodic structures are provided at a plurality of interfaces, the parameters of the respective photonic crystal periodic structures are designed independently.

The ratio (R/a) between the period a and the radius R is a value that is determined so that a photonic band gap (PBG) for TE light becomes maximum for each periodic structure. Such a structure is a structure obtained by, for example, forming a structure with a small refractive index in a medium with a large refractive index.

Alternatively, the ratio (R/a) between the period a and the radius R is a value that is determined so that a predetermined PBG for TM light becomes maximum for each periodic structure. Such a structure is a structure obtained by, for example, forming a structure with a large refractive index in a medium with a small refractive index.

For example, the ratio (R/a) between the period a and the radius R is a value that is determined by computing the size of a photonic band gap (PBG) for TE light or TM light in accordance with whether the periodic structure transmits or reflects light with a wavelength of $\lambda$ and in order to optimize the amount of transmission or reflection. For example, in order to allow the amount of light reflected to be larger than the amount of light transmitted at the interface and maximize the amount of light reflected, the value of R/a is determined so that a PBG for TE light becomes maximum. This is considered to be due to a phenomenon that an electric field of TE light is likely to accumulate in a connected structure of dielectrics that are present in the plane of the periodic structure in the parallel direction therewith, and thus that if the parameters of the periodic structure and the design wavelength satisfy the Bragg conditions, light with the design wavelength is reflected by the plane of the electric field due to Bragg diffraction.

Conversely, in order to allow the amount of light transmitted to be larger than the amount of light reflected at the interface and maximize the amount of light transmitted, the ratio (R/a) between the period a and the radius R is determined so that a PBG for TM light becomes maximum. This is considered to be due to a phenomenon that an electric field of TM light is likely to accumulate in dielectric spots that are present in the plane of the periodic structure in the direction perpendicular thereto, and thus that if the parameters of the periodic structure and the design wavelength satisfy the Bragg conditions, light with the design wavelength is reflected by the plane of the electric field due to Bragg diffraction, that is, the light passes through the plane of the periodic structure.

It should be noted that the value of R/a for TM light in the latter case is characterized in that the periodic structure has a PBG1 between a first band and a second band and has a PBG2 between a third band and a fourth band, and the sum of the PBG1 and the PBG2 exhibits the maximum value.

The parameters of each periodic structure are values that are ultimately determined so that the light extraction efficiency of the entire semiconductor light emitting element with respect to light with the wavelength $\lambda$ becomes maximum as a result of conducting a simulation analysis with the FDTD method using as variables the period a and the radius R, which have been determined from R/a for each order m of the Bragg conditions, and the depth h of the periodic structure that is greater than or equal to 0.5a. Herein, the depth h of the periodic structure that is greater than or equal to 0.5a is a value whose upper limit is also restricted depending on the actual processing accuracy.

By the way, each of the one or more interfaces may be at any location where a PGB is obtained in a periodic structure having two structures with different refractive indices, and examples thereof include, but are not limited to, the interface between the rear surface of a substrate of a semiconductor light emitting element and the air, the interface between the front surface of a substrate and a nitride semiconductor layer, the interface between a light emitting layer, a nitride semiconductor layer of a plurality of nitride semiconductor layers, and the air, the interface between the air and a nitride semiconductor layer after a substrate is peeled off, the interface between a fluorescent material and the air, and the interface between the rear surface of a substrate and a reflective film. Further, the periodic structure may be formed in a part of a region of an interface.

An optical semiconductor device in accordance with a first embodiment has the following structure.

1) A photonic crystal periodic structure has a structure in which the ratio (R/a) between the period a and the radius R is determined so that a photonic band gap (PBG) for TE light becomes maximum for each periodic structure, for example. Such a structure is, for example, a first structure obtained by forming a structure with a small refractive index in a medium with a large refractive index, such as a structure with holes formed therein.

FIG. 1A is a flowchart showing a flow of a first optimization process for the parameters of a photonic crystal periodic structure in accordance with a second embodiment of the present invention, which schematically shows a flow for maximizing a PBG for TE light.

First, in step S101, the ratio (R/a) between the period a and the radius R of the structure, which are the parameters of the periodic structure, are determined tentatively.

In step S102, the refractive indices $n_1$ and $n_2$ of the respective structures are computed, and the average refractive index $n_{av}$ is also computed from the refractive indices $n_1$ and $n_2$ and the R/a. Then, the obtained average refractive index $n_{av}$ is substituted into a formula of the Bragg conditions to obtain the period a and the radius R for each order m.

In step S103, a photonic band structure for TE light is analyzed with a plane wave expansion method using R/a, the wavelength λ, and the dielectric constants $\in_1$ and $\in_2$ of the respective structures obtained from the refractive indices $n_1$ and $n_2$.

In step S104, R/a at which a PBG between a first photonic band and a second photonic band for TE light becomes maximum is determined by repeating analyses while changing the tentatively determined value of R/a.

In step S105, the light extraction efficiency with respect to light with the wavelength λ is determined by conducting a simulation analysis of R/a at which the PBG becomes maximum with the FDTD method using as variables a given depth h of the periodic structure and the period a and the radius R that have been individually determined for each order m of the Bragg conditions.

In step S106, simulations with the FDTD method are repeated to determine the order m of the Bragg conditions at which the light extraction efficiency with respect to light with the wavelength λ becomes maximum and determine the depth h and the parameters of the periodic structure: the period a and the radius R corresponding to the order m.

2) The photonic crystal periodic structure has a structure in which the ratio (R/a) between the period a and the radius R is determined so that a photonic band gap (PBG) for TM light becomes maximum for each periodic structure. Such a structure is, for example, a second structure obtained by forming a structure with a large refractive index in a medium with a small refractive index, such as a structure with pillars formed therein.

Figure 1B:
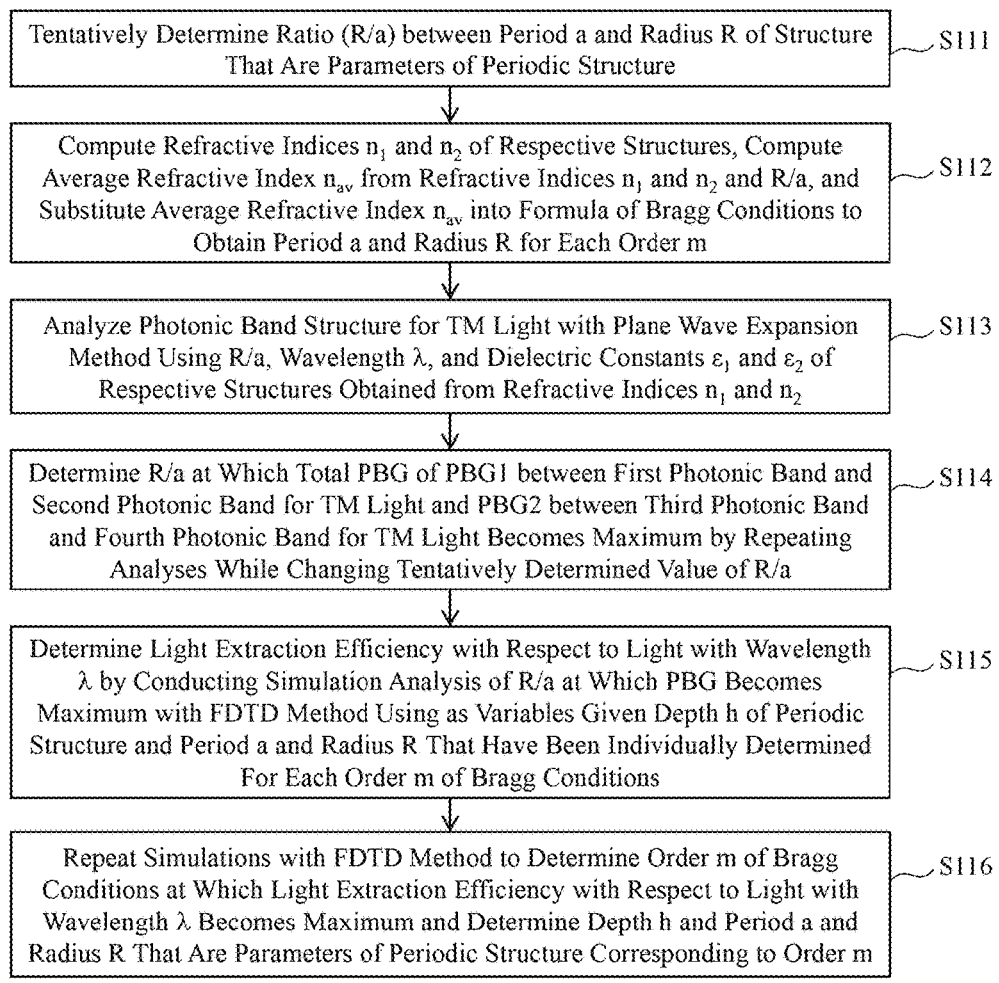
FIG. 1B is a flowchart showing a flow of a second optimization process for the parameters of a photonic crystal periodic structure in accordance with the second embodiment of the present invention, which schematically shows a flow for maximizing a PBG for TM light.

FIG. 1B is a flowchart showing a flow of a second optimization process for the parameters of a photonic crystal periodic structure in accordance with the second embodiment of the present invention, which schematically shows a flow for maximizing a PBG for TM light.

In step S111, the ratio (R/a) between the period a and the radius R of the structure, which are the parameters of the periodic structure, are determined tentatively.

In step S112, the refractive indices $n_1$ and $n_2$ of the respective structures are computed, and the average refractive index $n_{av}$ is also computed from the refractive indices $n_1$ and $n_2$ and the R/a. Then, the obtained average refractive index $n_{av}$ is substituted into a formula of the Bragg conditions to obtain the period a and the radius R for each order m.

In step S113, a photonic band structure for TM light is analyzed with a plane wave expansion method using R/a, the wavelength λ, and the dielectric constants $\in_1$ and $\in_2$ of the respective structures obtained from the refractive indices $n_1$ and $n_2$.

In step S114, R/a at which a total PBG, which is the sum of a PBG1 between a first photonic band and a second photonic band for TM light and a PBG2 between a third photonic band and a fourth photonic band for TM light becomes maximum, is determined by repeating analyses while changing the tentatively determined value of R/a.

In step S115, the light extraction efficiency with respect to light with the wavelength λ is determined by conducting a simulation analysis of R/a at which the PBG becomes maximum with the FDTD method using as variables a given depth h of the periodic structure and the period a and the radius R that have been individually determined for each order m of the Bragg conditions.

In step S116, simulations with the FDTD method are repeated to determine the order m of the Bragg conditions at which the light extraction efficiency with respect to light with the wavelength λ becomes maximum and determine the depth h and the parameters of the periodic structure: the period a and the radius R corresponding to the order m.

Second Embodiment

The second embodiment of the present invention relates to a method for computing the individual specific parameters of the photonic crystal periodic structure of the semiconductor light emitting element in accordance with the first embodiment.

Although the following description is based on a premise that the periodic structure has a triangular lattice pattern, the same computation method can be used for other tetragonal lattice patterns. In addition, the structure of projections/recesses that form the periodic structure may be either a pillar structure or a hole structure. That is, the structure may be selected in consideration of the complexity of processing and the easiness of the subsequent process.

In the design phase, it is possible to maximize the light extraction efficiency of the entire light emitting element by controlling or optimizing reflection or transmission of light from a light emitting layer for which a photonic crystal periodic structure is to be formed, by using a photonic crystal periodic structure with a PBG, which has been designed on the basis of the technique of this embodiment, formed at each of one or more interfaces between layers that form the light emitting element.

Figure 1C:
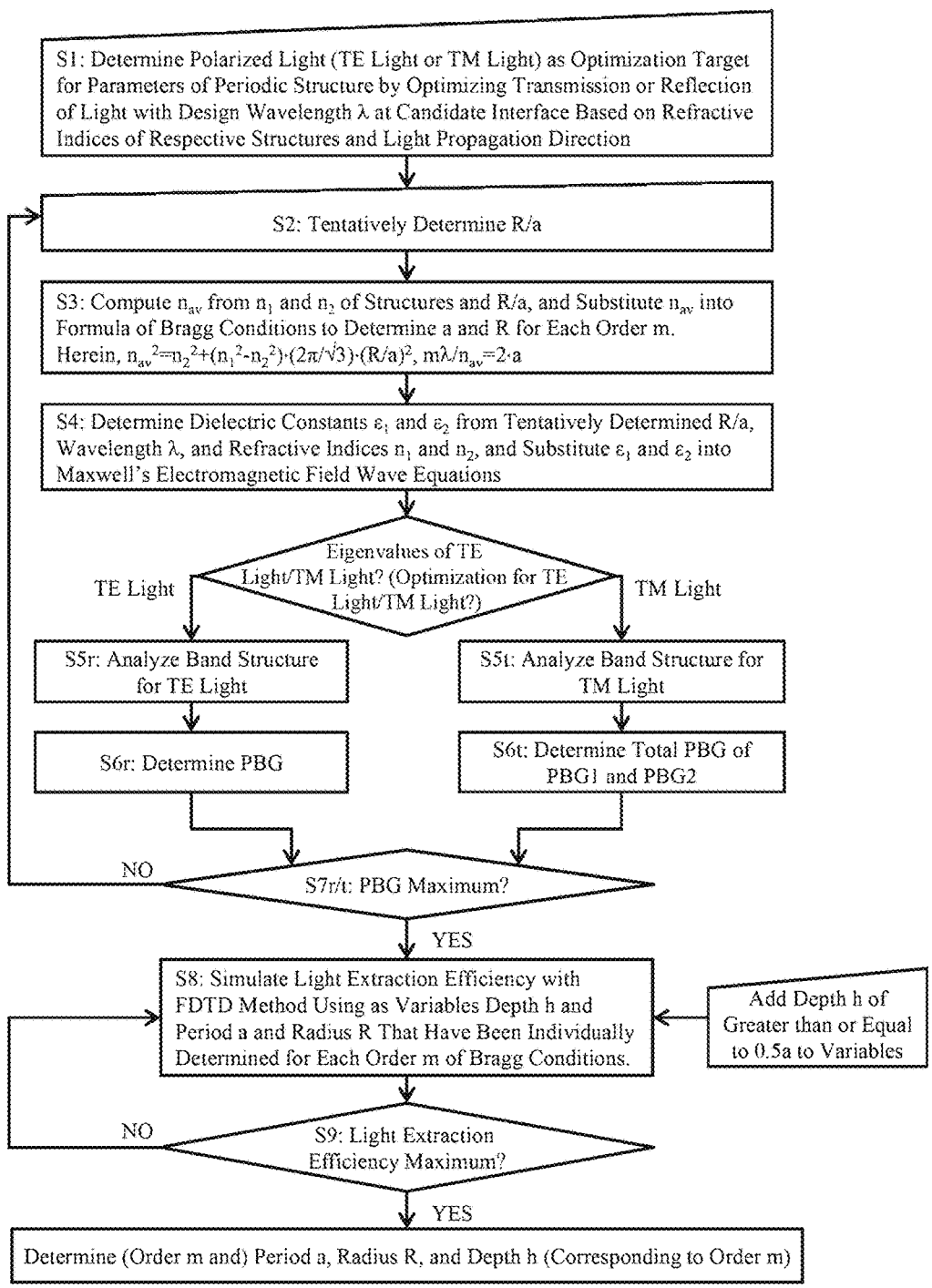
FIG. 1C is a diagram specifically showing a flow for optimizing the parameters of a photonic crystal periodic structure in accordance with the second embodiment of the present invention.

FIG. 1C is a diagram showing a schematic example of a flow of a computation process for optimizing the parameters of the periodic structure.

In step S1, a candidate interface on which a photonic crystal periodic structure is to be formed is considered. Herein, for example, whether light with the design wavelength λ of the semiconductor light emitting element is to be transmitted or reflected at the candidate interface is considered based on the magnitude relationship between the different refractive indices $n_1$ and $n_2$ of the structures that form the periodic structure and the light propagation direction, so that polarized light (i.e., TM light/TE light) that is an optimization target of the parameters of the periodic structure is determined. A table below (Table 1) shows patterns of specific combinations.

TABLE 1

| Light Propagation Direction and Magnitude Relationship between Refractive Indices | Objective of Forming Periodic Structure (Transmit/Reflect) | Polarized Light That is Optimization Target of Parameters of Periodic Structure |
| --- | --- | --- |
| Large → Small | Transmit | TM Light |
| Large → Small | Reflect | TE Light |

In step S2, the ratio (R/a) between the period a and the radius R of the structure, which are the parameters of the periodic structure, is determined tentatively.

In step S3, the average refractive index $n_{av}$ that is computed using Formula 1 is computed from the refractive indices $n_1$ and $n_2$ of the respective structures and R/a, and then, the obtained average refractive index $n_{av}$ is substituted into Formula 2 of the Bragg conditions (Formula 2) to obtain the period a for each order m. Likewise, the radius R for each order m is obtained from the tentatively determined R/a and a.

$$n_{av}^2 = n_2^2 + (n_1^2 - n_2^2)(2\pi/\sqrt{3})(R/a)^2 \quad \text{(Formula 1)}$$

$$m\lambda/n_{av} = 2a \quad \text{(Formula 2)}$$

Hereinafter, a band gap is analyzed with a plane wave expansion method on the basis of the values obtained as above.

In step S4, R/a, which has been tentatively determined in step S2, the wavelength λ, and the dielectric constants $\in_1$ and $\in_2$ of the respective structures obtained from the refractive indices ($n_1$ and $n_2$) are input into the Maxwell's electromagnetic field wave equations (Formula 3) that is obtained by expanding a plane wave with a wavelength of λ by an electric field E and a magnetic field H.

$$\text{TM Light} \sum_{G'} \varepsilon^{-1}(G-G')|k+G||k+G'|E'(G') = \quad \text{(Formula 3)}$$

$$(\omega^2/c^2) \; E'(G) \text{ and}$$

$$\text{TE Light} \sum_{G'} \varepsilon^{-1}(G-G')(k+G) \cdot (k+G')H(G') =$$

$$(\omega^2/c^2) \; H(G)$$

Herein, $\in^{-1}$ represents the inverse number of the dielectric constant, G represents the reciprocal lattice vector, ω represents the frequency, c represents the velocity of light, and k represents the wave number vector.

Hereinafter, a case where "reflection" (r) is selected for the periodic structure will be described. In step S5r, the eigenvalues of the Maxwell's electromagnetic field wave equations are computed in the wave number space for TE light determined as the optimization target in step S1, whereby a band structure for TE light is determined.

In step S6r, a PBG is determined from the difference between the first photonic band and the second photonic band of the photonic bands.

In step S7r, the steps of from step S2 to S6r are repeated to examine the value of R/a at which the PBG for TE light becomes maximum.

Hereinafter, steps S5t to S7t, which are performed by replacing steps S5r to S7r, when "transmission" (t) is selected for the periodic structure in step S1, will be described.

In step S5t, the eigenvalues of the Maxwell's electromagnetic field wave equations are computed in the wave number space for TM light determined as the optimization target in step S1, whereby a band structure for TM light is determined.

In step S6t, for the photonic band structure determined in step S5t, a PBG1 is determined from the difference between the first photonic band and the second photonic band, and likewise, a PBG2 is determined from the difference between the third photonic band and the fourth photonic band. Then, the sum of the PBG1 and the PBG2 is computed.

In step S7t, the steps of from S2 to S6t are repeated to examine the value of R/a at which the total PBG, which is the sum of the PBG1 and the PBG2 for TM light, becomes maximum.

Hereinafter, a common step that follows step S7r or step S7t will be described. In step S8, a simulation analysis is conducted on R/a at which the PBG becomes maximum in step S7r or S7t with the FDTD method using as variables a given depth h of the periodic structure and the period a and the radius R that have been individually determined for each order m of the Bragg conditions. Accordingly, the light extraction efficiency with respect to light with the wavelength λ is determined.

In step S9, step S8 is repeated to determine the order m of the Bragg conditions at which the light extraction efficiency with respect to light with the wavelength λ becomes maximum and determine the depth h and the parameters of the periodic structure: the period a and the radius R corresponding to the order m. Herein, the depth h is desirably a numerical value that is greater than or equal to 0.5a, though it is also possible to adopt a value that can obtain constant light extraction efficiency, taking into consideration the limitation of the processing accuracy.

As described above, according to the second embodiment of the present invention, specific, efficient design of a periodic structure is possible in accordance with the intended purpose of forming the periodic structure.

Third Embodiment

A third embodiment of the present invention relates to a parameter computation method for optimizing the parameters of second and third periodic structures that are formed at interfaces different from the interface at which the periodic structure optimized in accordance with the second embodiment is formed. It should be noted that the number of periodic structures is not specifically limited.

First, as step S10, consideration in step S1 is conducted again for a different interface.

Figure 1D:
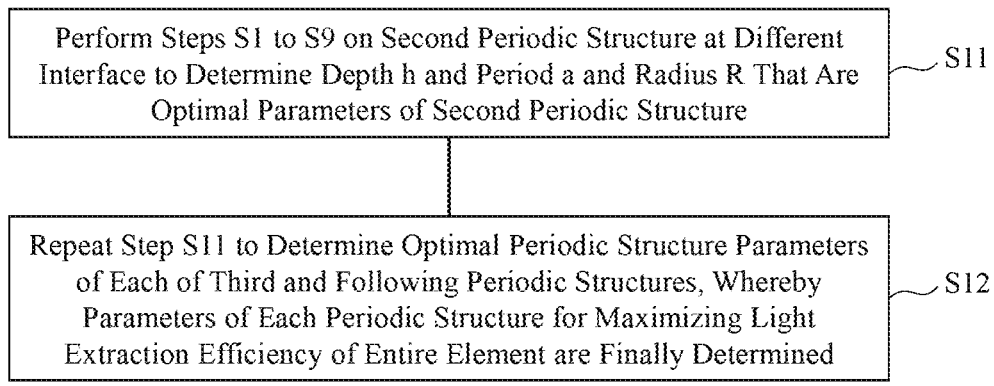
FIG. 1D schematically shows a flow for optimizing the parameters of a photonic crystal periodic structure in accordance with a third embodiment of the present invention.

As shown in FIG. 1D, in the next step S11, steps S1 to S9 are performed on the second periodic structure at the different interface, whereby the depth h and optimal parameters: the period a and the radius R of the second periodic structure are determined.

In step S12, step S11 is repeated to determine optimal periodic structure parameters of each of the third and following periodic structures. Finally, the parameters of each periodic structure for maximizing the light extraction efficiency of the entire element are determined.

According to the third embodiment, specific, efficient design of a periodic structure is possible in forming a periodic structure at each of a plurality of interfaces that contribute to maximizing the light extraction efficiency of the entire semiconductor light emitting element, in accordance with the structure of the element.

Fourth Element

A fourth embodiment of the present invention relates to a semiconductor light emitting element that is characterized in that a photonic crystal periodic structure is formed by using a transfer technology based on a nanoimprinting lithography method.

According to the fourth embodiment, a periodic structure can be transferred at a time to a large area of a surface of an object to be processed.

Fifth Embodiment

A fifth embodiment of the present invention is characterized in that the technology of transferring a photonic crystal periodic structure using a nanoimprinting lithography method is a transfer technology using a bi-layer resist method that includes coating a structure to be processed with lower-layer resist with high etching selectivity, and coating the lower-layer resist with upper-layer resist with fluidity and oxygen resistance.

A mold may be used for the transfer, and a resin film may be used for the mold. Specifically, the surface of a substrate on which a periodic structure is to be formed is coated with organic lower-layer resist with high etching selectivity with respect to the substrate through spin coating, for example. Next, the surface of the lower-layer resist is coated with silicon-containing upper-layer resist with fluidity and oxygen resistance through spin coating, for example. Next, a periodic structure is transferred to the surface of the upper-layer resist by a nanoimprinting lithography method using a mold. Then, the upper-layer resist, which has the periodic structure transferred thereto, is exposed to oxygen plasma so that oxygen resistance is imparted thereto and the residual film of the upper-layer resist that remains after the nanoimprinting transfer is removed. Next, the organic lower-layer resist is etched with oxygen plasma using the upper-layer resist with oxygen resistance as a mask, whereby a mask for dry-etching the substrate is formed. Finally, the substrate is dry-etched with ICP plasma using the mask as an etching mask.

The aforementioned steps are the transfer technology that uses a bi-layer resist method for a substrate. It should be noted that when such a technology is used, it is possible to obtain a transferred pattern with an etched depth of about 1.5 times (in the case of a sapphire substrate) the depth of the periodic structure on the mold by changing the thickness of the lower-layer resist. Further, it is also possible to adjust the diameter of a transferred pattern by about 30% of the diameter of the periodic structure on the mold by changing the oxygen plasma conditions in performing oxygen plasma etching of the organic lower-layer resist using as an etching mask the upper-layer resist with oxygen resistance that has the pattern transferred thereto.

According to the fifth embodiment, it is possible to accurately and correctly reproduce the fine periodic structure on the surface of an object to be processed in a controllable manner using a nanoimprinting lithography method.

This is specifically described below.

Example 1

Figure 2:
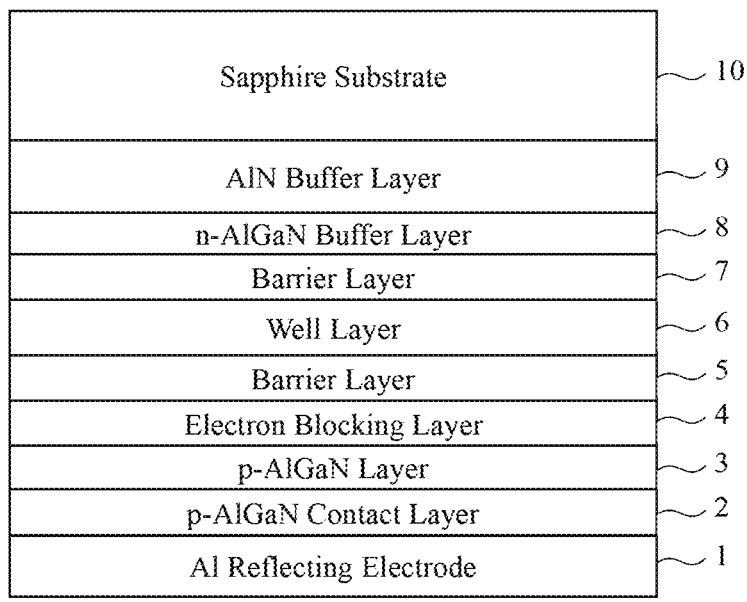
FIG. 2 shows an example of the structure of a deep ultraviolet LED.

A semiconductor light emitting element in Example 1 is a common deep ultraviolet LED, and includes, as shown in FIG. 2, an Al reflecting electrode 1 as well as layers stacked thereon, such as a p-AlGaN contact layer 2, a p-AlGaN layer 3, an electron blocking layer 4, a barrier layer 5, a well layer 6, a barrier layer 7, an n-AlGaN buffer layer 8, an AlN buffer layer 9, and a sapphire substrate 10. Light emitted from the well layer 6 is extracted to the outside of the LED element from the surface of the sapphire substrate 10 and the sidewalls of the Al reflecting electrode 1 and the sapphire substrate 10.

Figure 3A:
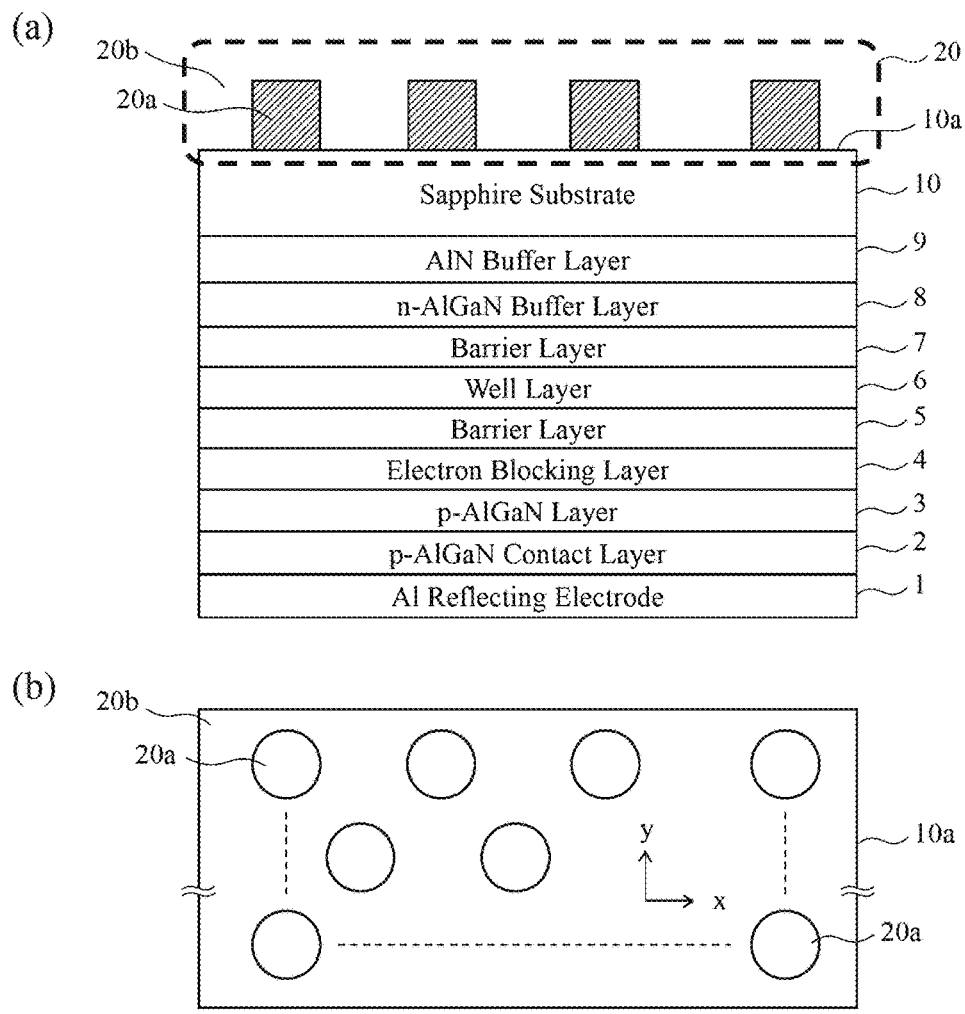
FIG. 3A is a diagram showing an example of the structure of a deep ultraviolet LED in accordance with an embodiment of the present invention, which shows an example of a pillar structure.

The design wavelength λ (i.e., central output wavelength λ) of the LED in Example 1 is 280 nm. A photonic crystal periodic structure that has maximized light extraction efficiency with respect to light with the design wavelength λ was formed. Such a structure is the second structure that is obtained by forming a structure with a large refractive index in a medium with a small refractive index. As shown in FIG. 3A(a), the interface between the surface (i.e., light extraction plane) 20a of the sapphire substrate 10, which is a light extraction layer, and the air is selected as a portion at which the second structure is to be formed. Herein, as shown in the XY plan view of FIG. 3A(b), the light extraction plane 10a has a pillar structure in which a structure formed of pillar portions 20a with optimal heights and a structure formed of a space portion 20b are formed in a triangular lattice pattern with a period of a along the X direction and the Y direction within the light extraction plane 10a.

An object of Example 1 is to, when light emitted from the well layer 6 propagates from the sapphire substrate 10 to the outside, optimize the photonic crystal periodic structure so as to maximize the amount of transmission of the light. In such a case, polarized light that should be used to optimize the parameters of the periodic structure is TM light as the refractive index of the sapphire substrate is greater than that of the outside air that transmits the light.

First, R/a to be optimized that is the ratio between the period a of the periodic structure and the radius R of the pillar structure is tentatively determined. Such a value fluctuates each time the following analysis is repeated. Accordingly, 0.24≤R/a≤0.40 was used in Example 1.

In Example 1, the refractive index $n_1$ of sapphire that is the pillar structure is 1.82, while the refractive index $n_2$ of the air is 1.0, and $n_1 > n_2$. $n_{av}$ is determined from Formula 1. Herein, a specific computation example for when R/a=0.31 is shown. Next, the prerequisite Bragg conditions are provided by Formula 2.

The formula of the Bragg conditions (Formula 2) can be understood from the fact that, as shown in FIG. 4A, an electric field of TM light is likely to accumulate in dielectric spots that are present between the pillar-structure rods in the direction perpendicular thereto, and when the average refractive index $n_{av}$, the period a, and the design wavelength λ satisfy the Bragg conditions, TM light is reflected by the plane of the electric field due to Bragg diffraction, that is, TM light passes through the plane of the periodic structure in Example 1.

Figure 3B:
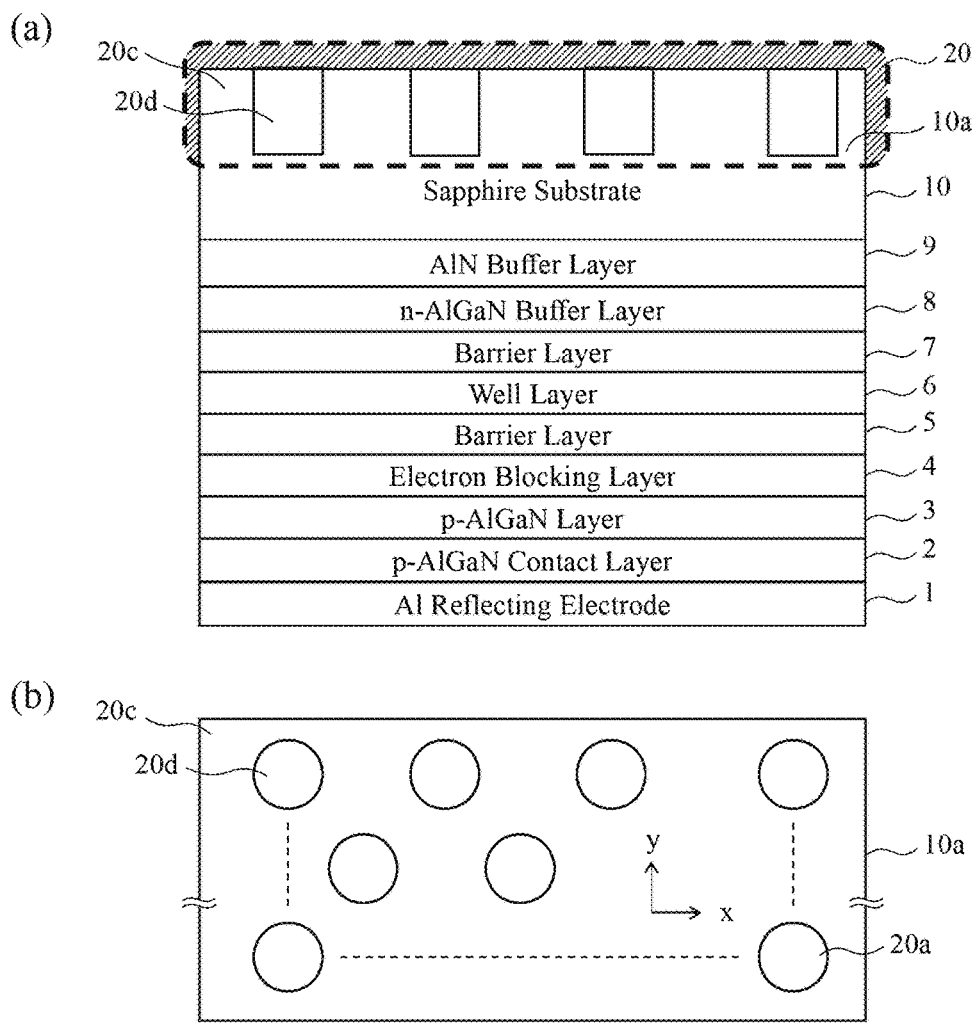
FIG. 3B is a diagram showing an example of the structure of a deep ultraviolet LED in accordance with an embodiment of the present invention, which shows an example of a hole structure.

Likewise, though different from Example 1, it is understood that, as shown in FIGS. 3B and 4B, an electric field of TE light is likely to accumulate in a connected structure of dielectrics that are present in the plane of the periodic structure in the parallel direction therewith, and when the average refractive index $n_{av}$, the period a, and the design wavelength λ satisfy the Bragg conditions, TE light is reflected by the plane of the electric field due to Bragg diffraction, that is, TE light is reflected by the plane of the periodic structure.

That is, FIG. 3B(a) shows the first structure that is obtained by forming a structure with a small refractive index in a medium with a large refractive index. In a portion where the first structure is formed, as shown in FIG. 3B(a), the light extraction plane 10a has a hole structure in which a structure formed of space portions 20d with optimal heights is formed in a medium 20c with a large refractive index in a triangular lattice pattern with a period of a along the X direction and the Y direction within the light extraction plane 10a. Hereinafter, an example of the second structure will be described in detail.

First, in Example 1, when R/a=0.31, the period a and the radius R, which are the parameters of the periodic structure, are computed for each order m of the Bragg conditions. Specifically, when m=2, a=208 nm and R=64.5 nm; when m=3, a=313 nm and R=97 nm; and when m=4, a=417 nm and R=129 nm. The reason that the order m is limited herein is described below.

Next, a band structure for TM light when R/a=0.31 is analyzed with a plane wave expansion method. That is, the eigenvalues of the Maxwell's electromagnetic field wave equations (Formula 3) are computed to confirm the presence and the size of a PBG. The dielectric constants $\in_1$ and $\in_2$ of the respective structures used to compute the eigenvalues can be determined from a formula below (Formula 4) for the respective refractive indices $n_1$ and $n_2$.

$$n^2 = \mu \in /\mu_0 \in_0 \quad \text{(Formula 4)}$$

(where μ represents the magnetic permeability, $\mu_0$ represents the magnetic permeability in a vacuum, and $\in_0$ represents the dielectric constant in a vacuum.)

Figure 5:
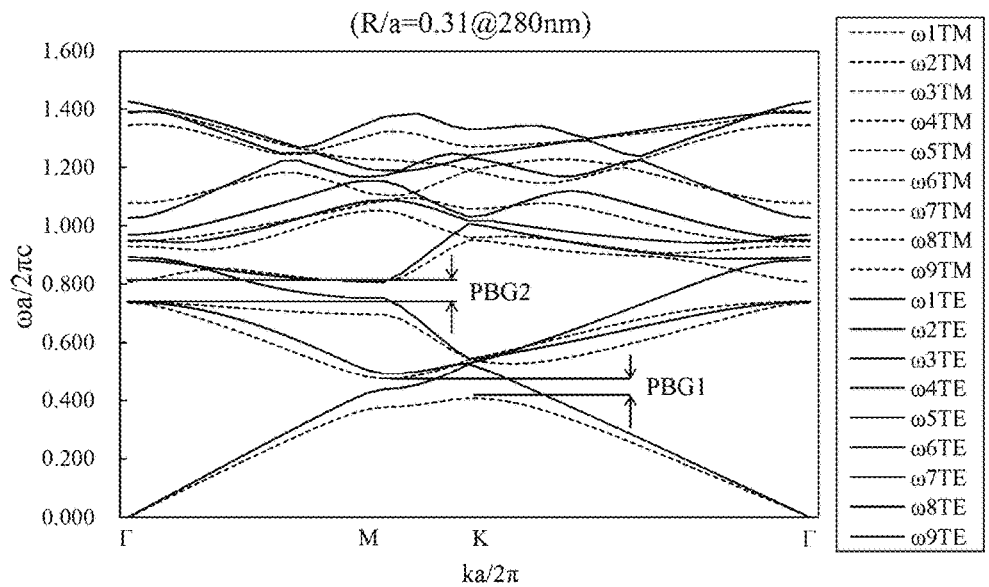
FIG. 5 shows band structures determined for the structures of FIG. 3 using a plane wave expansion method.

FIG. 5 shows photonic band structures (i.e., photonic crystals (pillars)) determined above for when R/a is 0.31. ωa/2πc on the ordinate axis can also be represented as a/λ. The gap PBG1 between the first photonic band (ω1TM) and the second photonic band (ω2TM) and the gap PBG2 between the third photonic band (ω3TM) and the fourth photonic band (ω4TM) are determined on the basis of FIG. 5, and a total PBG thereof is computed.

Although FIG. 5 also shows plotted photonic band structures for TE light, there is no PBG for TE light as can be seen from the results. However, abnormality in the group velocity is seen at an end of a band as with TM light. It is considered that the light propagation direction changes at the end of the band, and a part of light is thus reflected.

Figure 6:
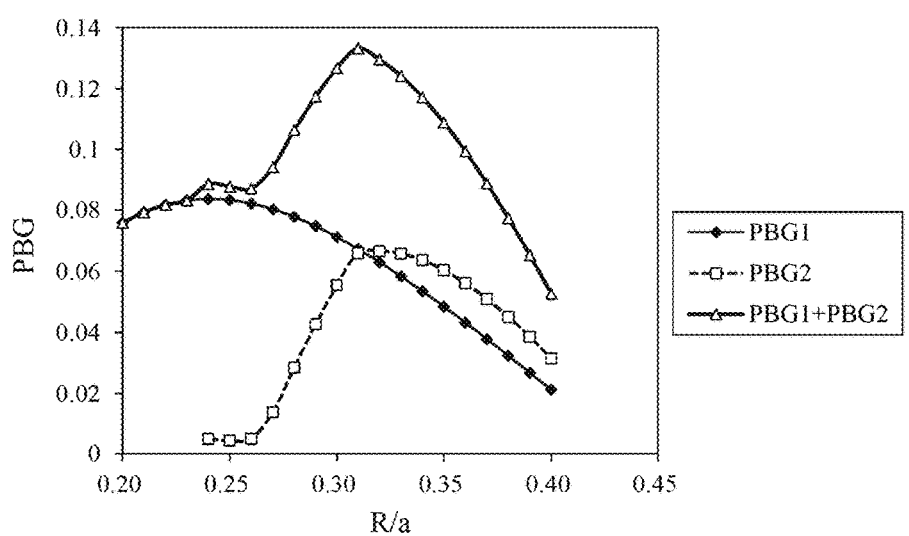

A total PBG of the PBG1 and the PBG2 for when R/a=0.31 is determined as described above. In order to find out the parameters of the periodic structure that can maximize the total PBG, a similar analysis is repeated for the range of R/a (0.24≤R/a≤0.40). FIG. 6 shows the results (i.e., characteristics of a PBG for TM light vs. R/a). It is found that the PBG is the maximum when R/a=0.31.

After R/a at which the PBG (=PBG1+PBG2) for TM light becomes maximum is determined, the period a and the radius R are individually determined from the ratio R/a for each order m of the Bragg conditions. Further, a simulation is conducted with the FDTD method by adding the depth h of the periodic structure to the parameters, whereby the light extraction efficiency of the LED element with respect to light with the design wavelength λ in Example 1 is computed.

It should be noted that the order m used herein is limited to the range of 1<m<5. If the order is m=1, the diameter of the pillar structure is about 40 nm, which has little difference from a differential spatial resolution of 20 nm that is obtained when the computation model is discretized. Thus, m=1 was excluded from the range, determining that it does not correctly reflect the actual pillar shape. If the order is m=5, the period is about 500 nm, which greatly differs from the design wavelength of 280 nm. Thus, m≥5 was also excluded from the range.

Figure 7:
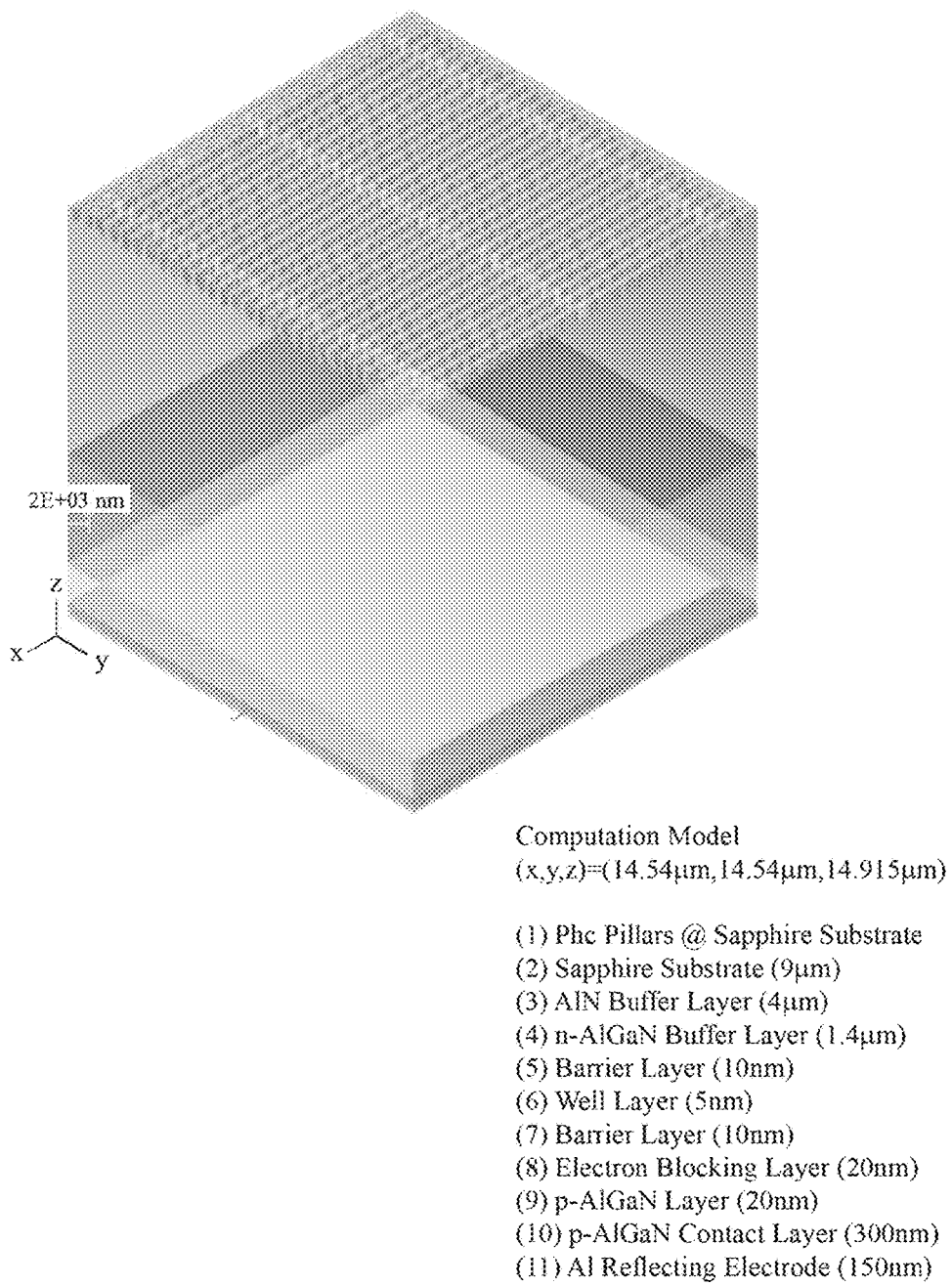
FIG. 7 shows a deep ultraviolet LED model used for a FDTD simulation.

A simulation that uses the FDTD method in Example 1 was conducted for a deep ultraviolet LED model with the size and the structure shown in FIG. 7 using a high-performance PC. Herein, a single electric dipole pulse light source, which has a design wavelength (i.e., center wavelength) of 280 nm, a half width of about 20 nm, and a light emission time of 60 fs and oscillates in the x, y, and z directions, was disposed as a light source at the center of the plane of the well layer 6, and was made to emit light. The degree of polarization p of the light was set to 0.38. Herein, the degree of polarization is p=(I⊥−I//)/(I⊥+I//), where I⊥ represents the intensity of components that are perpendicular to the c-axis of the sapphire substrate, and I// represents the intensity of components that are parallel with the c-axis of the sapphire substrate (hereinafter, the same). The refractive index, the extinction coefficient, the relative permeability, and the instantaneous relative dielectric constant of the Al reflecting electrode 1 were corrected using the Drude dispersion model at 280 nm, and were set to obtain a reflectivity of 70%. Further, considering the possibility that light emitted from the well layer 6 may disappear in the semiconductor due to absorption of free carriers, the extinction coefficient was set so that light emitted from the well layer 6 will be attenuated down to 1% when the light has propagated a distance of about 30 μm from the n-AlGaN buffer layer 8 to the p-AlGaN contact layer 2. Six observation planes for an electric field and a magnetic field were disposed outside the LED element, and pointing vectors were computed and output. It should be noted that the increase-decrease rate of LEE was computed through comparison of output values between a case where a photonic crystal periodic structure is not provided (Non-PhC) and a case where it is provided (PhC).

Typically, the output values of the FDTD method include those of a far field and a near field, and the computation methods and the properties of the output values thereof differ. In order to obtain a near field, time waveforms of an electric field and a magnetic field E(t) and H(t) are acquired on the observation planes outside the LED element, and the time waveforms are transformed into frequency spectra E(ω) and H(ω) through Fourier transform. In addition, the output value is computed from a pointing vector S=E×H, which is the output product of an electric field and time, and the surface integral is determined on the observation plane, so that the output wavelength characteristics are obtained.

Meanwhile, a far field is obtained with a different computation method from that of a near field. First, c closed region (i.e., equivalent electromagnetic flow region) is set outside the LED element. Then, equivalent current Js=n×Hs and equivalent electromagnetic flow Ms=n×Es (where n represents a normal vector of the closed region s) are computed from a magnetic field Hs and an electric field Es on the surface of the closed region generated from the LED. Herein, an equivalence theorem that an electromagnetic field generated from the LED is equal to an electromagnetic field generated from an equivalent electromagnetic flow to the outside of the region is used. Thus, a far field is computed by determining an electric field on the observation plane at a given far distance from the LED using Maxwell's equations in a vacuum as in the next formula (Formula 5).

$$W(r,t) = (1/4)\pi rc\{\partial/\partial t[\int s Js(t-(r-r_1)r_0/c]ds\}$$

$$U(r,t) = (1/4)\pi rc\{\partial/\partial t[\int s Ms(t-(r-r_1)r_0/c]ds\}$$

$$E\theta(r,t) \approx -U\varphi(r,t) - ZW\theta(r,t)$$

$$E\varphi(r,t) \approx U\theta(r,t) - ZW\varphi(r,t)$$

$$E\theta(r,\omega) = F[E\theta(r,t)]$$

$$E\varphi(r,\omega) = F[E\varphi(r,t)], \quad \text{(Formula 5)}$$

where θ represents the latitude on the observation spherical surface, φ represents the longitude on the observation spherical surface, r represents the distance between the LED light source and the observation point, $r_1$ represents the distance between the LED light source and the plane of the closed region, $r_0$ represents a unit vector between the LED light source and the observation point, c represents the velocity of light, Z represents a field impedance, and F[ ] represents Fourier transform.

Accordingly, a far field for each wavelength (frequency) can be obtained. In the analysis of Example 1, only a near field was used for the reason that the computation model was not equal to that of the actual LED and that the light extraction efficiency of photonic crystal periodic structures with different R/a were compared.

A table below (Table 2) shows the results of the FDTD simulation. The increase-decrease rate of the light extraction efficiency of each of the sidewall portions (i.e., four surfaces), the top surface portion, and both of them (i.e., total) of the LED element is shown as the average value at wavelengths of 275 to 285 nm.

TABLE 2

| Compared Pattern | Diameter (nm) | Period (nm) | Increase-Decrease Rate (%) of Sidewalls | Increase-Decrease Rate (%) of Top Portion | Total Increase-Decrease Rate (%) |
|---|---|---|---|---|---|
| Hole_R/a0.25_m3 | 126 | 252 | 10.8 | 24.9 | 15.0 |
| Hole_R/a0.30_m3 | 158 | 263 | 10.8 | 33.4 | 17.4 |
| Hole_R/a0.35_m3 | 195 | 278 | 9.6 | 39.6 | 18.5 |
| Hole_R/a0.40_m3 | 239 | 299 | 9.3 | 45.7 | 20.1 |
| Pillar_R/a0.24_m2 | 110 | 230 | 7.3 | 17.6 | 10.3 |
| Pillar_R/a0.24_m3 | 166 | 345 | 6.6 | 33.3 | 14.5 |
| Pillar_R/a0.24_m4 | 221 | 460 | 8.0 | 40.2 | 17.6 |
| Pillar_R/a0.31_m2 | 129 | 208 | 7.2 | 31.0 | 15.4 |
| Pillar_R/a0.31_m3 | 194 | 313 | 8.1 | 42.9 | 18.5 |
| Pillar_R/a0.31_m4 | 258 | 417 | 9.1 | 47.4 | 20.5 |
| Pillar_R/a0.32_m2 | 131 | 205 | 7.5 | 30.4 | 14.3 |
| Pillar_R/a0.32_m3 | 197 | 308 | 8.3 | 42.1 | 18.4 |
| Pillar_R/a0.32_m4 | 263 | 411 | 8.8 | 46.1 | 19.9 |
| Pillar_R/a0.36_m2 | 140 | 194 | 8.1 | 35.7 | 16.2 |
| Pillar_R/a0.36_m3 | 209 | 291 | 8.5 | 41.9 | 18.4 |
| Pillar_R/a0.36_m4 | 279 | 388 | 9.2 | 44.5 | 19.7 |
| Pillar_R/a0.40_m2 | 146 | 183 | 8.4 | 35.8 | 16.5 |
| Pillar_R/a0.40_m3 | 220 | 274 | 9.5 | 39.8 | 18.5 |
| Pillar_R/a0.40_m4 | 293 | 366 | 8.8 | 39.4 | 17.9 |

The table shows the average value of the increase-decrease rate of the light extraction efficiency at 275 nm to 285 nm. In addition, the table shows the results of simulations conducted on the pillar structure adapted in Example 1 and a hole structure, and also shows the results of simulations conducted on R/a other than R/a (=0.31) at which the sum of the PBG 1 and the PBG 2 for TM light becomes maximum, combining the purpose of verification.

FIG. 8 show the output waveform characteristics of the sidewalls (FIG. 8A), the top portion (FIG. 8B), and the sum of them (FIG. 8C) of the deep ultraviolet LED model in accordance with the difference between a case where a photonic crystal periodic structure is provided and a case where it is not provided and also in accordance with the difference in the shape of the photonic crystal periodic structure. Further, each numerical value shows only the value when the depth h of the periodic structure is 500 nm.

From the results, it was found that the parameters of the periodic structure that has the maximum light extraction efficiency are: a pillar structure, R/a=0.31, the order m=4, the period a=417 nm, and the radius R=129 nm, and that the increase-decrease rate of the light extraction efficiency of the sidewalls, the increase-decrease rate of the light extraction efficiency of the top portion, and the total increase-decrease rate of the light extraction efficiency are 9.1%, 47.4%, and 20.5%, respectively (when compared with a case where a photonic crystal periodic structure is not provided).

Example 2

Figure 9:
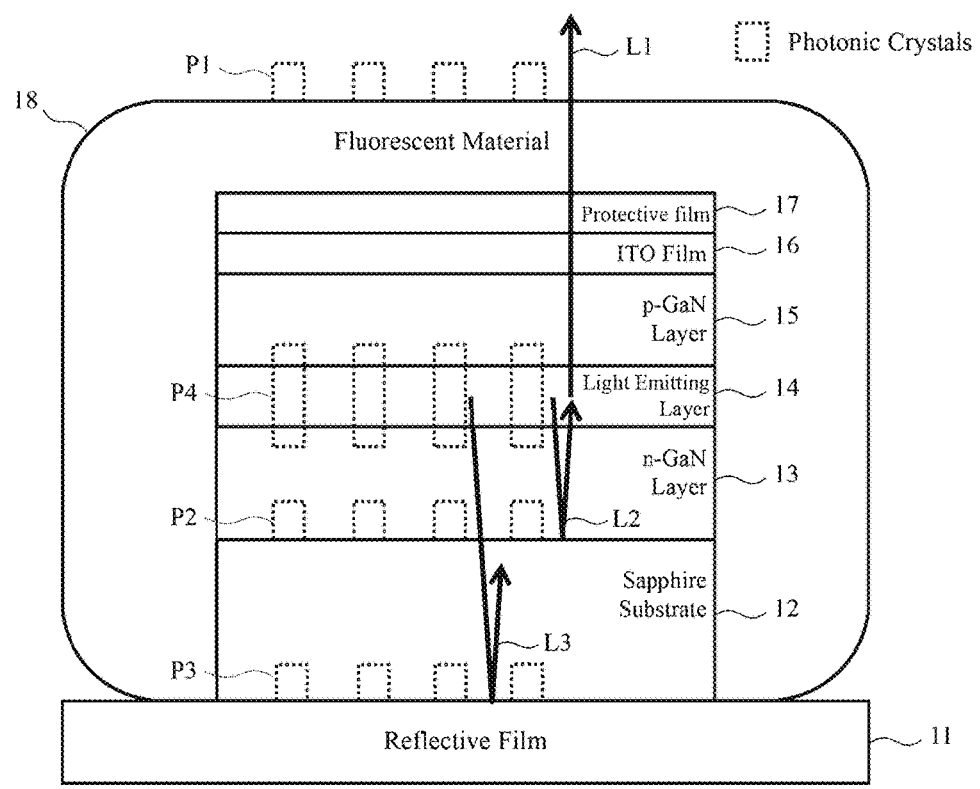
FIG. 9 shows an example of the structure of a white LED as an embodiment of the present invention.

Next, Example 2 will describe an example in which a photonic crystal periodic structure for maximizing the light extraction efficiency is formed at each of one or more interfaces between layers that form a common white LED element. First, FIG. 9 shows a schematic structure of a white LED element. That is, the white LED element includes a reflective film 11, a sapphire substrate 12, an n-GaN layer 13, a light-emitting layer 14, a p-GaN layer 15, an ITO film 16, a protective film 17, and a fluorescent material 18 that covers the LED element. Light emitted from the light emitting layer 14 can be broadly classified into light L1 that passes through the ITO transparent electrode film 16 and the protective film 17 and is extracted to the outside from the interface between the fluorescent material 18 and the air, light L2 that is reflected by the interface between the sapphire substrate 12 and the n-GaN layer 13 and is then extracted to the outside as with the light L1, and light L3 obtained as the light L2 has passed through the interface between the sapphire substrate 12 and the n-GaN layer 13 and is reflected by the interface between the sapphire substrate 12 and the reflective film 11, and is then extracted to the outside again as with the light L1. The degree of polarization p of light of such a white LED was set to 0.89.

In Example 2, a photonic crystal periodic structure P having a pillar structure is formed at the interface between the fluorescent material 18 and the air as in Example 1, a photonic crystal periodic structure P2 having a pillar structure is formed at the interface between the sapphire substrate 12 and the n-GaN layer 13, and a photonic crystal periodic structure P3 having a hole structure with holes is formed at the interface between the sapphire substrate 12 and the reflective film 11.

Herein, in the periodic structure P1, the refractive index of the fluorescent material 18 is greater than that of the air. Thus, the present invention is applied to TM light to optimize the parameters so as to allow transmission of the light L1. In the periodic structure P2, the refractive index of the n-GaN layer 13 is greater than that of the sapphire substrate 12. Thus, the present invention is applied to TE light to optimize the parameters so as to reflect the light L2. Further, in the periodic structure P3, the refractive index of the sapphire substrate 12 is greater than that of the air (i.e., holes). Thus, the present invention is applied to TE light to optimize the parameters so as to reflect the light L3.

It is also possible to form a photonic crystal periodic structure P4 with a hole structure, which satisfies the conditions of the refractive index difference and the depth, in the light emitting layer 14. In such a case, as the light emitting layer 14 is provided in the plane of the photonic crystal periodic structure in the depth direction thereof, light is scatted toward the top and bottom sides. Meanwhile, if the thickness of the light emitting layer 14 is not sufficient, the hole structure may be formed in a region including each of the GaN layers (13 or 15) that sandwich the light emitting layer 14 and have no difference in the refractive index from the light emitting layer 14.

Further, though not shown, if pillars are formed at the interface between an exposed surface of the n-GaN layer 13, which is obtained by removing the sapphire substrate 12 like a flip-chip structure, and the air, light can efficiently pass through the air.

Combining the formation of any of the aforementioned periodic structures P1 to P4 can obtain a combination that most improves the light extraction efficiency of the entire LED element, optimal periodic structure parameters (i.e., the order m, the period a, and the radius R) of each periodic structure, and the depth h.

A table below (Table 3) shows the relationship between the function (purpose) of a photonic crystal periodic structure at a processed position of the periodic structure and the parameters of the periodic structure obtained through implementation of the present invention.

by spin coating. It should be noted that the thickness g is selectively determined in accordance with the etching selectivity of the lower-layer resist with respect to the sapphire substrate. After that, silicon-containing upper-layer resist with fluidity and an oxygen resistance function is formed on the surface of the lower-layer resist to a predetermined thickness by spin coating (FIG. 10(*a*)).

Figure 10:
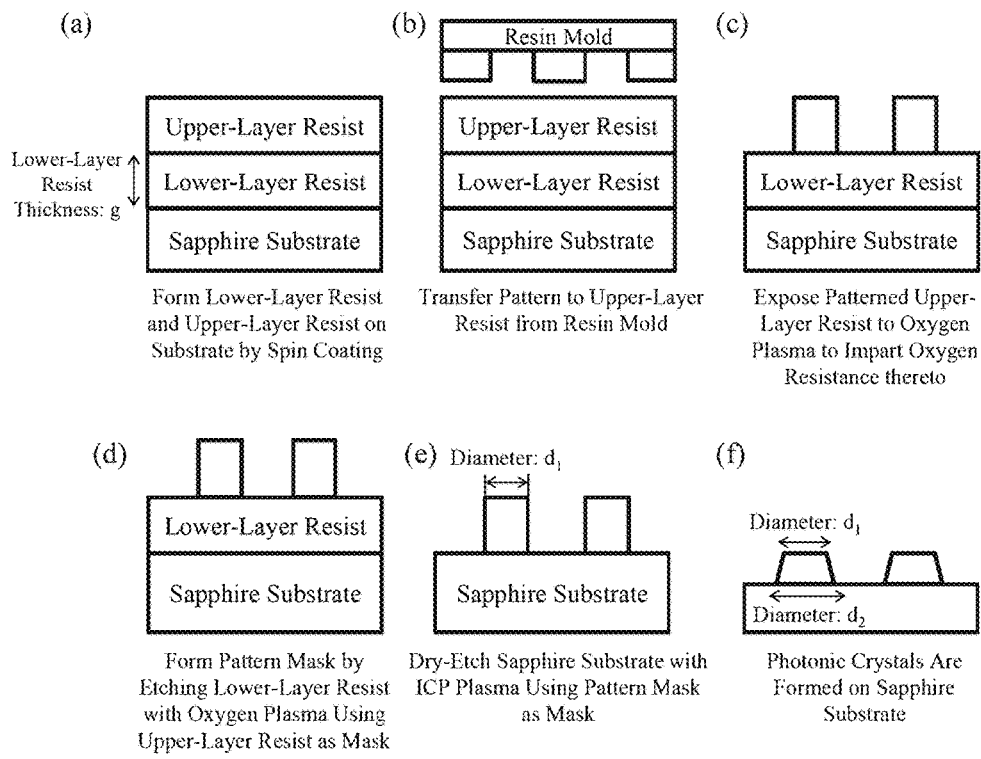
FIG. 10 show an example of a method for forming a photonic crystal periodic structure as an embodiment of the present invention.
Figure 11:
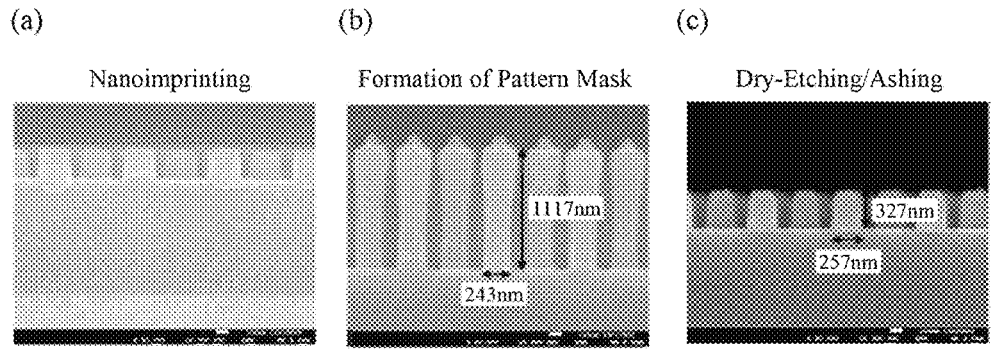
FIG. 11 show the actual SEM photograms of FIGS. 10(b), 10(e), and 10(f).

Next, a pattern of the mold is transferred to the upper-layer resist using a nanoimprinting apparatus (FIG. 10(*b*)).

Next, the upper-layer resist that has the pattern of the mold transferred thereto is exposed to oxygen plasma so that oxygen resistance is imparted thereto and the residual film of the upper-layer resist that remains after the nanoimprinting transfer is removed (FIG. 10(*c*)).

Next, the organic lower-layer resist is etched with oxygen plasma using the upper-layer resist with oxygen resistance as a mask, whereby a pattern mask for dry-etching the sapphire substrate is formed (FIG. 10(*d*)). It is possible to finely adjust the diameter $d_1$ of the pattern mask on the sapphire substrate side shown in FIG. 10(*e*) by an amount within the range of about 30% of $d_1$ by adjusting the oxygen plasma conditions.

TABLE 3

| Processed Position | Function | Wavelength (nm) | Shape | Medium 1 (Refractive Index) | Medium 2 (Refractive Index) | R/a | PBG Maximum Value | Diameter/ Period m2: (nm) | Diameter/ Period m3: (nm) | Diameter/ Period m4: (nm) |
|---|---|---|---|---|---|---|---|---|---|---|
| Fluorescent Material | Transmit | 500 | Pillar | Fluorescent Material (1.5) | Air (1.0) | 0.33 | 0.0367 | 270/409 | 405/614 | 540/818 |
| Light Emitting Layer | Reflect | 455 | Hole | Air (1.0) | GaN (2.5) | 0.40 | 0.1270 | 203/254 | 305/381 | 407/508 |
| Front Surface of Sapphire Substrate | Reflect | 455 | Pillar | Sapphire (1.78) | GaN (2.5) | 0.36 | 0.0005 | 150/208 | 224/311 | 299/415 |
| Rear Surface of Sapphire Substrate | Transmit | 455 | Hole | Air (1.0) | Sapphire (1.78) | 0.40 | 0.0590 | 263/329 | 395/494 | 527/658 |

Example 3

As shown in Table 2, when a case where the order m=4 and R/a=0.31 is compared with a case where the order m=4 and R/a=0.32, the difference in the light extraction efficiency of pillars at the top portion is 1.3 points, and the difference in the total value is 0.6 points. When the shapes (i.e., diameter/period) are compared, the former case has 258 nm/417 nm, while the latter case has 263 nm/411 nm, which shows a difference in the shape as small as several nm. Thus, in order to obtain better light extraction efficiency, it is necessary to perform processing on the order of nm as computed.

Thus, in Example 3, a photonic crystal periodic structure with a fine pattern on the order of nm is transferred to a sapphire substrate as shown in FIG. 10 as an example, using a transfer technology that is based on a nanoimprinting lithography method using bi-layer resist that can provide both high fluidity and high etching selectivity. This is described below with reference to FIG. 10.

First, a die for accurately reproducing a periodic structure optimized through implementation of the present invention on a sapphire substrate is created. For the mold, it is possible to use a mold made of resin so that the mold can follow warp of the substrate as shown in FIG. 10(*b*).

Next, organic lower-layer resist with high etching selectivity is formed on the sapphire substrate to a thickness of g The sapphire substrate is dry-etched with ICP plasma using the pattern mask, whereby a periodic structure optimized through implementation of the present invention is formed (FIG. 10(*e*)).

When the periodic structure has a pillar structure, the structure after the etching process has generally a trapezoidal shape where $d_1 < d_2$ as shown in FIG. 10(*f*), and the angle of the sidewalls depends on the etching selectivity of the organic lower-layer resist. It should be noted that according to Example 3, changing the thickness g of the organic lower-layer resist can easily form a photonic crystal periodic structure, which has a depth of about 1.5 times that of the mold, on a sapphire substrate after dry etching.

In addition, changing the diameter $d_1$ in forming a pattern mask can easily change the diameter of the periodic structure by about 30%. This can replace re-creation of a mold, which can contribute to reducing the production time and cost of the mold, and thus has a significant advantage in terms of the production cost of the semiconductor light emitting element.

FIGS. 1(*a*) to (*c*) show the actual SEM photographs (i.e., SEMs of the cross-sections of phC pillars formed through a nanoimprinting process) of FIGS. 10(*b*), 10(*e*), and 10(*f*), respectively, which are indicated by "Nanoimprinting," "Formation of Pattern Mask," and "Dry-Etching/Ashing."

Processes and control can be implemented by software processing of a CPU (Central Processing Unit) or a GPU (Graphics Processing Unit) or hardware processing of an ASIC (Application Specific Integrated Circuit) or an FPGA (Field Programmable Gate Array).

In the aforementioned embodiments, structures and the like that are shown in the attached drawings are not limited thereto, and can be changed appropriately within the range that the advantageous effects of the present invention can be achieved. Besides, such structures and the like can be implemented by being changed appropriately within the scope of the objects of the present invention.

Each component of the present invention can be freely selected, and an invention with a freely selected structure is also included in the present invention.

It is also possible to record a program for implementing the function described in the embodiment on a computer-readable recording medium, and cause a computer system to read the program recorded on the recording medium and execute the program so as to perform a process of each unit. It should be noted that the "computer system" herein includes an OS and hardware of peripheral devices and the like.

In addition, the "computer system" also includes a website providing environment (or a displaying environment) if the system uses a www system.

The "computer-readable recording medium" means a portable medium such as a flexible disk, a magneto-optical disk, ROM, or CD-ROM; or a storage device such as a hard disk incorporated in a computer system. Further, the "computer-readable recording medium" also includes a medium that dynamically holds a program for a short period of time, such as a communication line for transmitting a program via a network like the Internet or a communication line like a telephone line, and a medium that holds a program for a given period of time, like a volatile memory in a computer system that serves as a server or a client in that case. Alternatively, the program may implement some of the aforementioned functions, and may further implement the aforementioned functions by being combined with a program that is already recorded in the computer system. At least some of the functions may be implemented by hardware such as an integrated circuit.

INDUSTRIAL APPLICABILITY

The present invention is applicable as semiconductor light emitting elements.

REFERENCE SIGNS LIST a Period of photonic crystal periodic structure
R Radius of periodic structure
h Processing depth of periodic structure
1 Al reflecting electrode
2 p-AlGaN contact layer
3 p-AlGaN layer
4 Electron blocking layer
5 Barrier layer
6 Well layer
7 Barrier layer
8 n-AlGaN buffer layer
9 AlN buffer layer
10 Sapphire substrate
10a Light extraction plane
20a Pillar portion
20b Space portion
11 Reflective film
12 Sapphire substrate
13 n-GaN layer
14 Light emitting layer
15 p-GaN layer
16 ITO film
17 Protective film
18 Fluorescent material
L1 Transmitted light
L2 Reflected light
L3 Reflected light
P1-P4 Photonic crystal periodic structure All publications, patents, and patent applications that are cited in this specification are all incorporated by reference into this specification.

The invention claimed is:

1. A semiconductor light emitting element with a design wavelength of λ, comprising:
a transmitted-type photonic crystal periodic structure including a plurality of pillar structures, each having a radius of R at a backside of a substrate, wherein the photonic crystal periodic structure is formed by two-types of structures, air having a refractive index $n_2$, and the substrate having refractive index $n_1$,
wherein the photonic crystal periodic structure has two photonic band gaps, wherein the photonic band gaps are open for TM polarization component, and have an average refractive index $n_{av}$ of the two-types of structures, the average refractive index $n_{av}$ satisfies Bragg conditions $m\lambda/n_{av}=2a$, wherein $n_{av}$ is calculated by the equation of $n_{av}=(n_2^2+(n_1^2-n_2^2)(2\pi/\sqrt{3})(R/a)^2)^{1/2}$, a is a period of the pillar structures, an order m of the Bragg conditions is 4, $0.31 \leq R/a \leq 0.36$, and a depth of each of the pillar structures $h \geq 0.5a$.

* * * * *